United States Patent
Sutani et al.

(10) Patent No.: US 7,108,945 B2
(45) Date of Patent: Sep. 19, 2006

(54) PHOTOMASK HAVING A FOCUS MONITOR PATTERN

(75) Inventors: Takumichi Sutani, Yokohama (JP); Kyoko Izuha, Yokohama (JP); Tadahito Fujisawa, Tokyo (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 10/396,309

(22) Filed: Mar. 26, 2003

(65) Prior Publication Data
US 2003/0219655 A1 Nov. 27, 2003

(30) Foreign Application Priority Data
Mar. 27, 2002 (JP) .......................... P2002-090010

(51) Int. Cl.
*G01F 9/00* (2006.01)
(52) U.S. Cl. .......................................... 430/5
(58) Field of Classification Search .................. 430/5, 430/22, 30; 356/399
See application file for complete search history.

(56) References Cited

U.S. PATENT DOCUMENTS

| | | | |
|---|---|---|---|
| 5,300,786 A | 4/1994 | Brunner et al. | 250/548 |
| 6,376,139 B1 | 4/2002 | Fujisawa et al. | 430/30 |
| 6,440,616 B1 * | 8/2002 | Izuha et al. | 430/5 |
| 2002/0100012 A1 | 7/2002 | Sutani et al. | |
| 2002/0182521 A1 | 12/2002 | Fujisawa et al. | |

FOREIGN PATENT DOCUMENTS

| | | |
|---|---|---|
| JP | 2539163 | 7/1996 |
| JP | 9-329889 | 12/1997 |
| JP | 2803963 | 7/1998 |
| JP | 2000-310850 | 11/2000 |
| JP | 2001-189264 | 7/2001 |

OTHER PUBLICATIONS

Notice of Grounds for Rejection issued by the Japanese Patent Office, mailed Feb. 21, 2006, for Japanese Patent Application No. 2002-090010, and English-language translation thereof.

* cited by examiner

*Primary Examiner*—S. Rosasco
(74) *Attorney, Agent, or Firm*—Finnegan, Henderson, Farabow, Garrett & Dunner, L.L.P.

(57) ABSTRACT

A photomask has a device pattern, which has an opening portion and a mask portion, and either a focus monitor pattern or an exposure dose monitor pattern, which has an opening portion and a mask portion and which has the same plane pattern shape as at least a partial region of a device pattern. The phase difference in transmitted exposure light between the opening portion and the mask portion of the focus monitor pattern is different from that between the opening portion and the mask portion of the device pattern. The opening portion of the exposure dose monitor pattern has a different exposure dose transmittance from that of the opening portion of the device pattern.

25 Claims, 15 Drawing Sheets 50
(PHASE DIFFERENCE :
180 DEGREES)

60
(PHASE DIFFERENCE :
120 DEGREES)

52 (PHASE DIFFERENCE: -120 DEGREES)

62 (PHASE DIFFERENCE: +120 DEGREES)

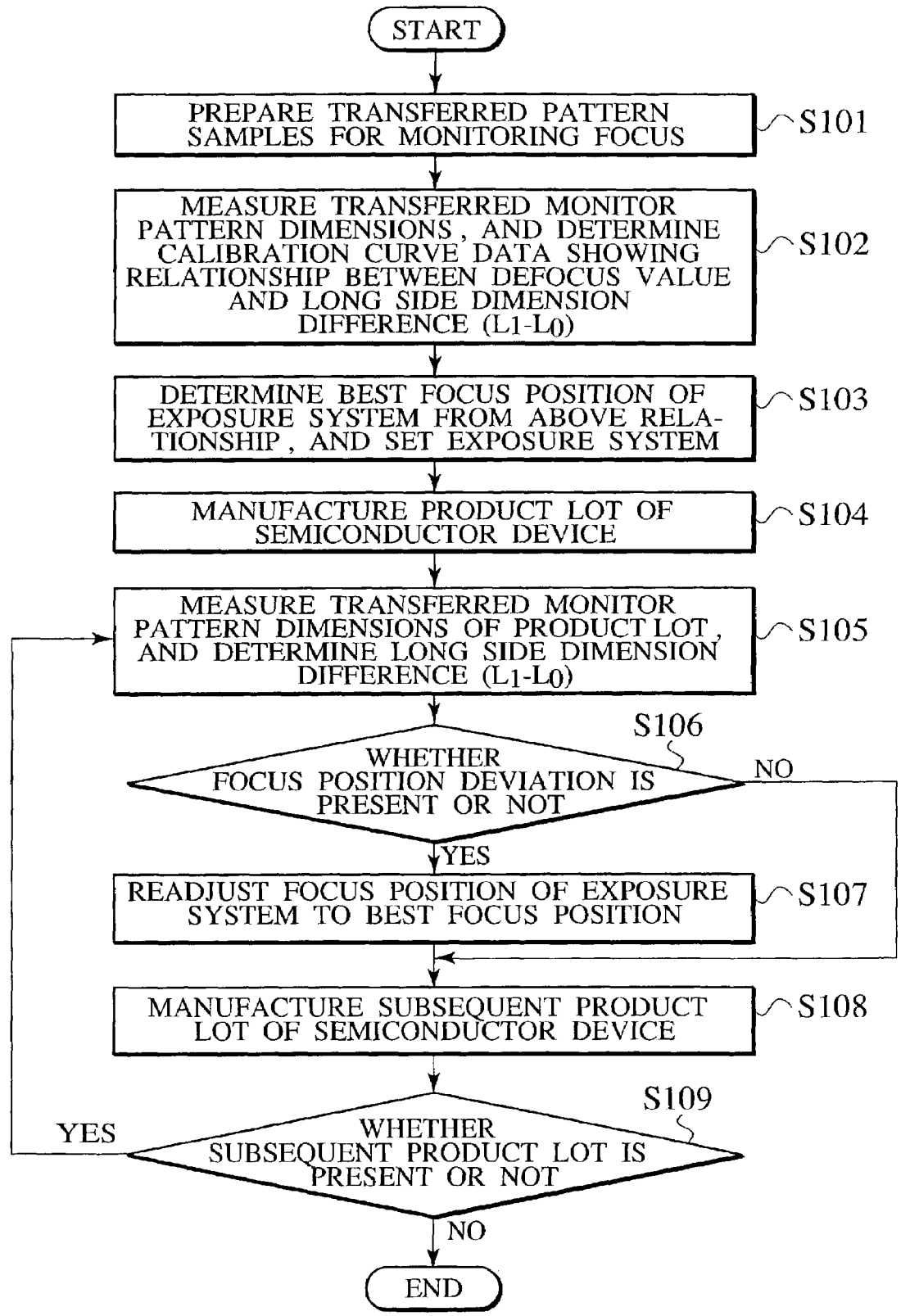

PHOTOMASK HAVING A FOCUS MONITOR PATTERN

CROSS REFERENCE TO RELATED APPLICATION

This application is based upon and claims the benefit of priority from prior Japanese Patent Application No. 2002-090010, filed on Mar. 27, 2002; the entire contents of which are incorporated herein by reference.

BACKGROUND OF THE INVENTION

1. Field of the Invention

The present invention relates to semiconductor device manufacturing, and more specifically, to a photomask, a method of controlling the focus condition or the exposure dose condition of an exposure system for use in a photolithography process using the photomask, and a semiconductor device manufacturing method using the controlling method.

2. Description of the Related Art

With the trend toward finer device patterns, tolerances for process conditions (process margins), such as the depth of focus, the exposure dose adjustment, and the like of an exposure system, in a photolithography process have been decreased. Accordingly, what is desired is a high accuracy controlling (monitoring) method for an exposure dose condition and the like minimizing error factors which consume process margins.

Heretofore, a focus condition has been controlled by measuring the length l (diagonal main axis length) of a rhombic pattern 1010 as shown in FIG. 1B, which is transferred on a wafer using a photomask provided with a rhombic monitor pattern 1000 having a diagonal minor axis length of approximately 0.5 μm, for example, as shown in FIG. 1A.

FIG. 2 shows the relationship between a deviation distance from a focus position (defocus value) and the length l of the rhombic pattern 1010 transferred on a wafer. As the rhombic pattern 1010 approaches the best focus, the resolution of the rhombic pattern 1010 is getting higher, and a finer edge portion thereof can be transferred on a wafer. Consequently, the length l of the rhombic pattern 1010 reaches the maximum value at the position of the best focus and decreases with increasing defocus value. Accordingly, when semiconductor device manufacturing is performed, before a product lot is released into a manufacturing process, the relationship between the defocus value and the length l of the rhombic pattern 1010 transferred on a wafer is determined, and the best focus condition in the exposure process for the product lot are decided.

In the case where the focus condition for the product lot is controlled, a transferred pattern is fabricated using a photomask provided with the rhombic pattern 1000 under the same exposure condition as that for the product lot, and the length l of the transferred rhombic pattern 1010 is measured, thus monitoring the defocus value.

However, in a heretofore-known focus monitoring method using the above-described rhombic pattern, it is impossible to obtain information as to whether the focus deviation of an exposure system has been in an upward or downward direction. Moreover, the size and shape of a monitor pattern are significantly different from those of a device pattern. Accordingly, when the variations in an exposure dose and the like occur, the sensitivity of the monitor pattern to these variations is different from that of the device pattern, which sometimes reduces the reliability for monitoring.

A method of monitoring focus without being influenced by exposure dose includes a method of detecting the variation amount of focus as a positional deviation amount of patterns, which is disclosed in U.S. Pat. No. 5,300,786. However, in this method, since the detection sensitivity for focus largely depends on the shape (σ) of a light source, a sufficient sensitivity can be obtained under an exposure condition in which σ is relatively low, but a sufficient sensitivity cannot be obtained under a generally used condition in which σ is relatively high or under a condition in which annular illumination is used.

Moreover, an exposure dose monitoring method is disclosed in Japanese Unexamined Patent Publication No. 2000-310850. In this method, special patterns are used for monitoring exposure dose, and either the dimensions of the patterns transferred on a wafer or the deviation between the center positions of the patterns is measured, thus making it possible to monitor exposure dose. However, also in this case, a device pattern and an exposure dose monitor pattern have completely different dimensions and shapes. Accordingly, when both of these patterns have different sensitivities to the exposure dose, it cannot be said that the exposure dose is accurately monitored for the device pattern.

SUMMARY OF THE INVENTION

A first photomask according to a first aspect of the present invention includes a mask substrate, a device pattern which is disposed on the mask substrate and has an opening portion and a mask portion, and a first focus monitor pattern which is disposed on the mask substrate and has an opening portion and a mask portion. The first focus monitor pattern has the same plane pattern shape as at least a partial region of the device pattern. Here, a phase difference in transmitted exposure light between the opening portion and the mask portion of the first focus monitor pattern is different from that between the opening portion and the mask portion of the device pattern.

A second photomask according to a second aspect of the present invention includes a mask substrate; a device pattern which is disposed on the mask substrate and has an opening portion and a mask portion, a first focus monitor pattern which is disposed on the mask substrate and has an opening portion and a mask portion, and a second focus monitor pattern which is disposed on the mask substrate and has an opening portion and a mask portion. The first focus monitor pattern has the same plane pattern shape as at least a partial region of the device pattern, and the second focus monitor pattern has the same plane pattern shape as the first focus monitor pattern. Here, a phase difference in transmitted exposure light between the opening portion and the mask portion of the second focus monitor pattern and a phase difference in transmitted exposure light between the opening portion and the mask portion of the first focus monitor pattern have approximately the same absolute values and opposite signs.

A method of monitoring focus according to an aspect of the present invention includes preparing focus calibration curve data showing a relationship between a deviation distance from a focus of an exposure light source and a dimension difference between corresponding portions of a first focus monitor pattern transferred on a wafer and any one of a device pattern, a reference monitor pattern, and a second focus monitor pattern transferred on the wafer using the above-described first or second photomask. Moreover, the method includes fabricating a device pattern of a semiconductor device using the photomask, measuring a dimension difference ΔL between corresponding portions of a first focus monitor pattern transferred on a wafer and any one of a device pattern, a reference monitor pattern, and a second focus monitor pattern transferred on the wafer by the step of fabricating the device pattern, detecting a deviation distance ΔD from the focus of the exposure light source based on the measured dimension difference ΔL and the focus calibration curve data, and adjusting a position of the exposure light source to a focus position based on the detected deviation distance ΔD from the focus.

A method of manufacturing a semiconductor device according to an aspect of the present invention is to manufacture a semiconductor device using the above-described focus monitor method under conditions in which a focus position of an exposure light source is controlled.

A third photomask according to a third aspect of the present invention includes a mask substrate, a device pattern which is disposed on the mask substrate and has an opening portion and a mask portion, and an exposure dose monitor pattern which is disposed on the mask substrate and has an opening portion and a mask portion. The exposure dose monitor pattern has the same plane pattern shape as at least a partial region of the device pattern. Moreover, a phase difference in transmitted exposure light between the opening portion and the mask portion of the exposure dose monitor pattern is the same as that between the opening portion and the mask portion of the device pattern, and the opening portion of the exposure dose monitor pattern has a different transmittance for exposure light from that of the opening portion of the device pattern.

A method of monitoring exposure dose according to an aspect of the present invention includes preparing exposure dose calibration curve data showing a relationship between exposure dose and a dimension difference between corresponding specific portions of an exposure dose monitor pattern transferred on a wafer and any one of a device pattern and a reference monitor pattern transferred on the wafer using the above-described third photomask of the present invention. This method further includes: fabricating a device pattern of a semiconductor device using the photomask; measuring a dimension difference ΔL between corresponding portions of an exposure dose monitor pattern transferred on a wafer and any one of a device pattern and a reference monitor pattern transferred on the wafer in the step of fabricating the device pattern; detecting a variation value ΔE of the exposure dose of an exposure light source based on the measured dimension difference ΔL and the exposure dose calibration curve data; and adjusting the exposure dose based on the detected variation value ΔE of the exposure dose.

Another method of manufacturing a semiconductor device according to another aspect of the present invention is to manufacture a semiconductor device using the above-described exposure dose monitoring method under conditions in which exposure dose is controlled.

BRIEF DESCRIPTION OF THE DRAWINGS

FIG. 22 is a flowchart showing the procedure of a semiconductor device manufacturing method using a focus monitoring method according to the first embodiment.

DETAILED DESCRIPTION OF THE EMBODIMENTS

First Embodiment

Hereinafter, referring to the accompanying drawings, a photomask according to a first embodiment of the present invention, a focus monitoring method using the photomask, and a semiconductor device manufacturing method using the focus monitoring method will be described.

First, taking a fabrication process of a device isolation layer for example, which requires the most strict pattern accuracy in a semiconductor device manufacturing process, the photomask and the focus monitoring method will be described.

Figure 1A:
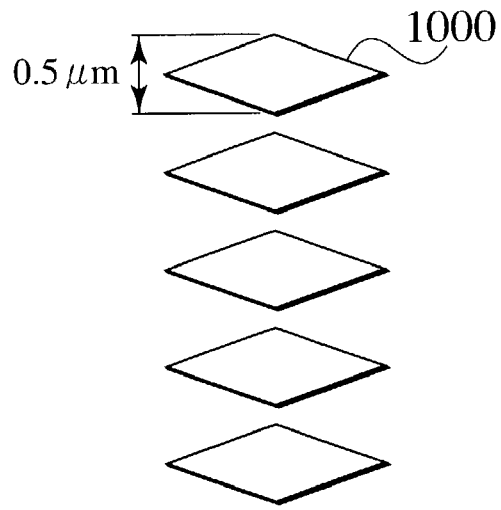
FIGS. 1A and 1B are schematic plan views, which show a monitor pattern used in a heretofore-known focus monitoring method.
Figure 1B:
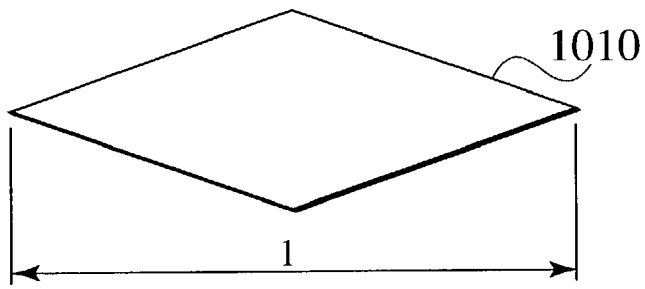
Figure 2:
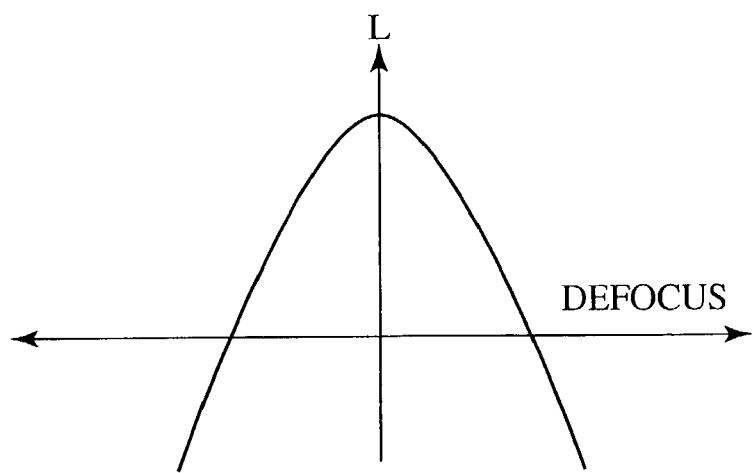
FIG. 2 is a graph showing the relationship between defocus and the length 1 of a transferred pattern when the heretofore-known monitor pattern is used.
Figure 3A:
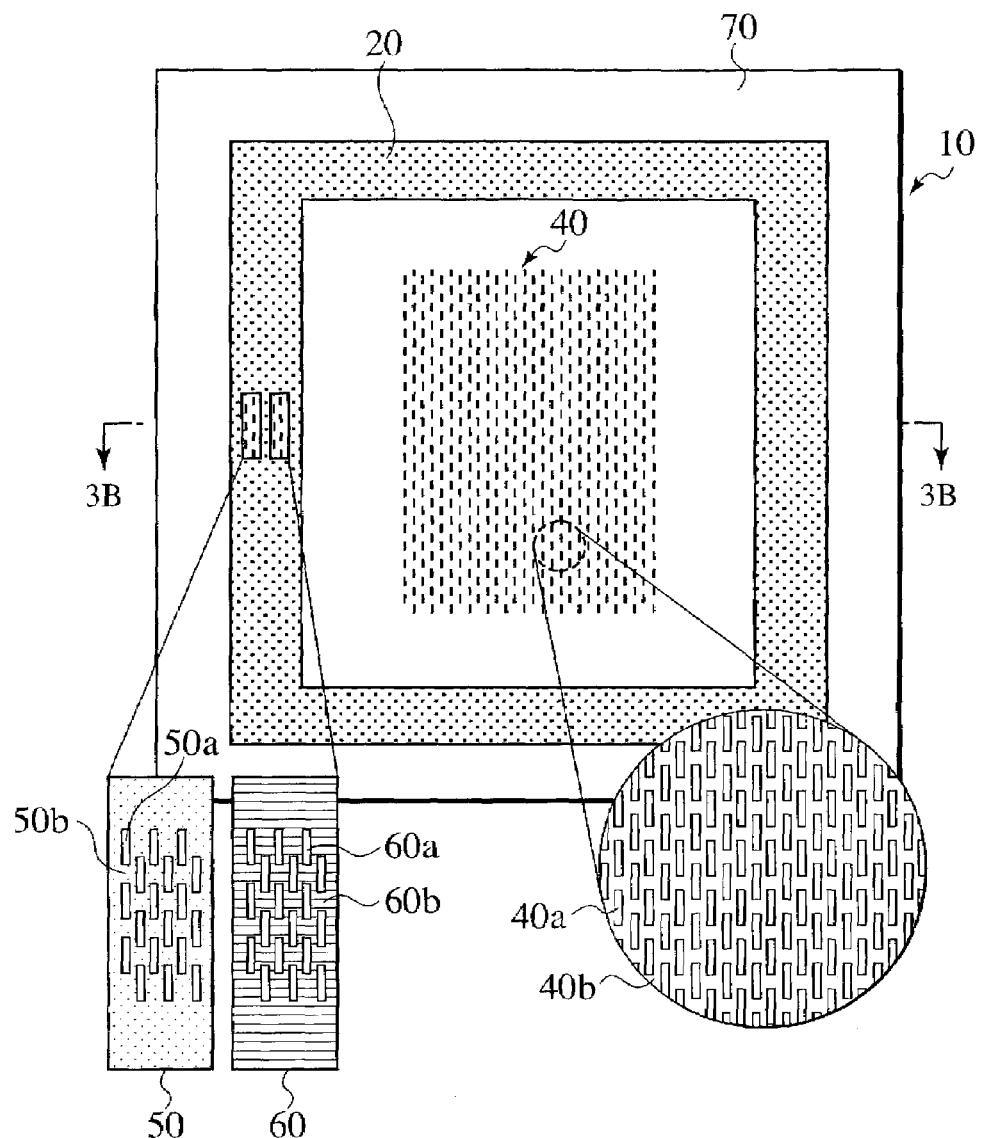
FIG. 3A is a plan view of a photomask according to a first embodiment.
Figure 3B:
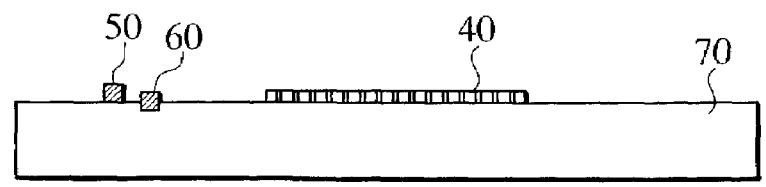
FIG. 3B is a cross-sectional view thereof.

FIGS. 3A and 3B are respectively an enlarged plan view and a cross-sectional view of the photomask 10 used in a photolithography process of a device isolation pattern. The mask shown in FIG. 3A corresponds to one chip.

As shown in FIGS. 3A and 3B, the photomask 10 according to the first embodiment, for example, has a device pattern 40, in which a device isolation pattern 40a equivalent to a fine rectangular opening portion is repeatedly located in almost the center thereof, and has two monitor patterns for monitoring focus in the surrounding region thereof on which the device pattern 40 is not located. One of the two monitor patterns is a reference monitor pattern 50, and the other is a first focus monitor pattern 60.

The reference monitor pattern 50 and the first focus monitor pattern 60 may be located any region as far as the region is one on a wafer where the device pattern 40 is not formed and where an influence is not exerted on the device pattern 40. Both of these patterns are not necessary after a chip separation process and therefore can be formed, for example, in a region 20 on the photomask 10 which corresponds to a dicing region of a wafer.

As the reference monitor pattern 50 and the first focus monitor pattern 60, a pattern having the same plane shape as that of a partial pattern of the device pattern 40 is formed. Specifically, unit opening portions 50a and 60a having the same shape and size as those of the device isolation pattern 40a are arranged at the same pitch and in the same direction as those thereof.

It is preferable to set the region sizes of the reference monitor pattern 50 and the first focus monitor pattern 60 so that pattern transfer conditions, that is, conditions in a series of photolithography processes including resist forming, exposure, and development, may be almost the same as those for the device pattern 40. For example, if the pitch for unit opening portions is several tens nm, region sizes are set so that the unit opening portions can be repeatedly arranged in an area at least several μm square or more.

The photomask according to the first embodiment has a feature in that the reference monitor pattern 50 has the same mask conditions as those for the device pattern 40. Specifically, the phase difference in transmitted exposure light between the opening portion 50a and the other region than the opening portion 50b (such a region is hereinafter referred to as a "mask portion") of the reference monitor pattern 50 is the same as the phase difference in transmitted exposure light between the opening portion 40a and a mask portion 40b of the device pattern 40, whereas the phase difference in transmitted exposure light between the opening portion 60a and a mask portion 60b of the first focus monitor pattern 60 is set so as to be different from that of the device pattern 40.

Figure 4A:
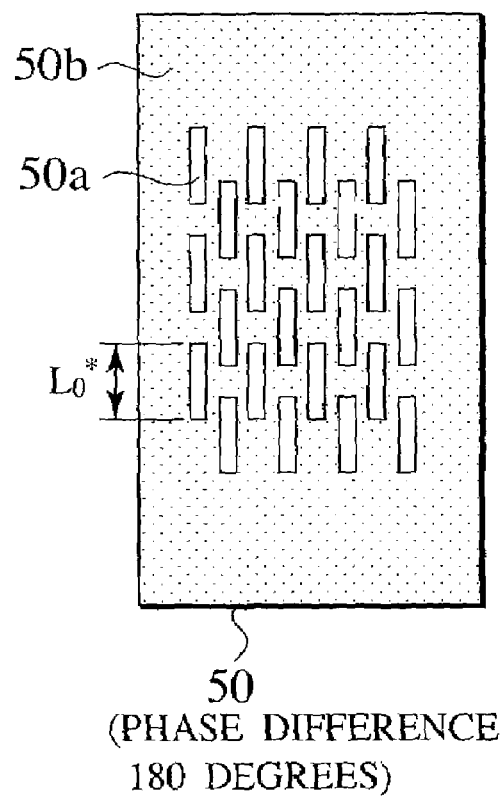
FIGS. 4A and 4B are plan views of monitor patterns for monitoring focus, which are formed on the photomask according to the first embodiment.
Figure 4B:
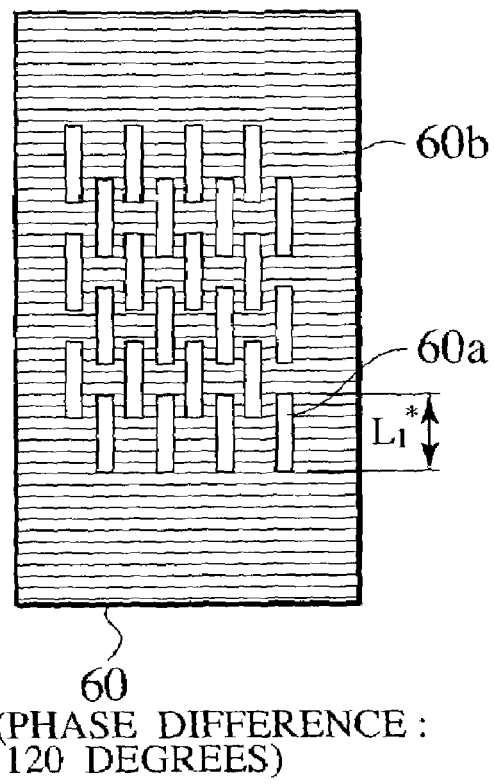

Enlarged plan views of the reference monitor pattern 50 and the first focus monitor pattern 60 are respectively shown in FIGS. 4A and 4B. The reference monitor pattern 50, for example, has the opening portions 50a with a transmittance of almost 100% for exposure light and the mask portion 50b with a transmittance of approximately 6% for the exposure light, and the phase difference in the transmitted exposure light between the opening portion 50a and the mask portion 50b is, for example, approximately 180 degrees. These conditions are the same as those for the device pattern 40.

On the other hand, the first focus monitor pattern 60 also has the opening portions 60a with a transmittance of almost 100% for the exposure light and the mask portion 60b with a transmittance of approximately 6% for the exposure light. However, the thickness of the mask portion 60b, for example, is adjusted, thus setting the phase difference in the transmitted exposure light between the opening portion 60a and the mask portion 60b to 120 degrees, which is different from the phase differences of the device pattern 40 and the reference monitor pattern 50, that is, 180 degrees.

Here, L0* denotes the long side dimension of the opening portion 50a of the reference monitor pattern 50 on the mask, and L1* denotes the long side dimension of the opening portion 60a of the first focus monitor pattern 60 on the mask. Incidentally, the long side dimension of each opening portion of a transferred pattern, which is formed on a wafer using the mask, is denoted by L1 or L2, where the mark "*" is deleted. Hereinafter, the same denoting manner is used also in descriptions of other embodiments.

Note that respective concrete phase differences of the reference monitor pattern 50 and the first focus monitor pattern 60 are decided by a method described below.

Figure 5A:
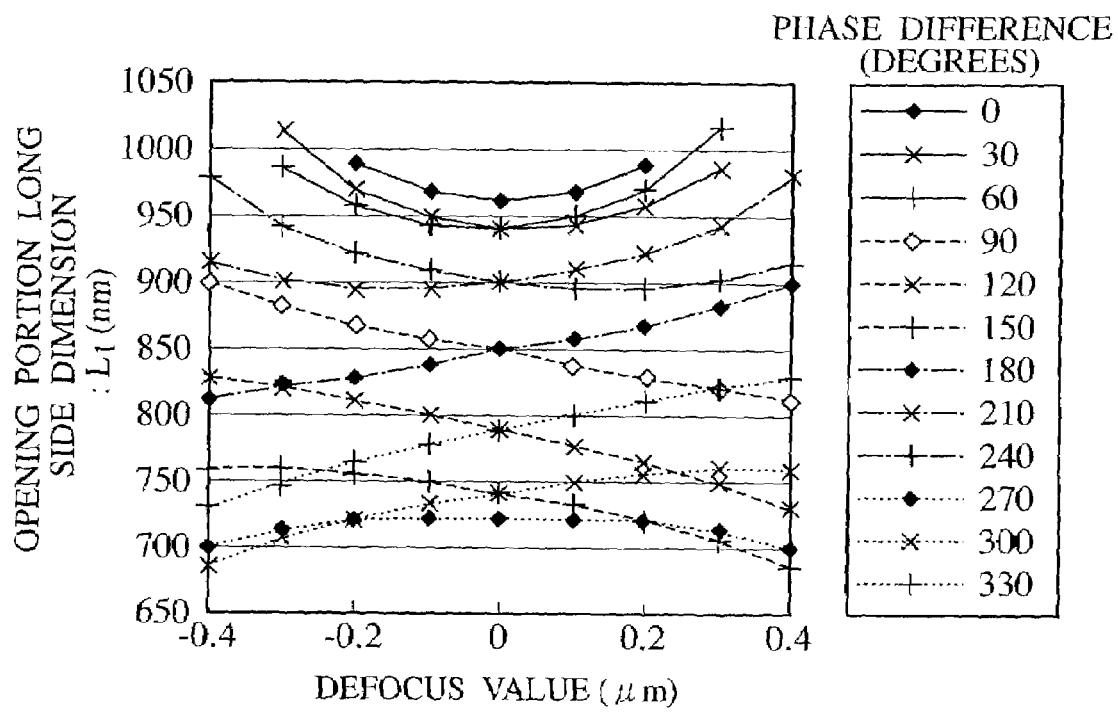
FIG. 5A is a graph showing the relationship between a defocus value and an opening dimension L1, where the phase difference of a first focus monitor pattern 60 according to the first embodiment is used as a parameter.

FIG. 5A is a graph showing the relationship between the deviation distance from the focus position of an exposure light source (hereinafter simply referred to as the "defocus value") and the long side dimension L1 of the opening portion 60a transferred on a wafer, which is determined by simulations using the phase difference in transmitted exposure light between the opening portion 60a and the mask portion 60b of the first focus monitor pattern 60 as a parameter (such a phase difference is hereinafter simply referred to as a "phase difference"). The vertical axis shows the long side dimension L1 in units of nm, and the horizontal axis shows the defocus value in units of μm. In this graph, the design dimension for the long side dimension L1 of the opening portion 60a is 720 nm. From the graph of FIG. 5A, it can be confirmed that the behavior of change in the long side dimension L1 of the opening portion 60a with respect to the defocus value greatly differs depending on the phase difference.

Figure 5B:
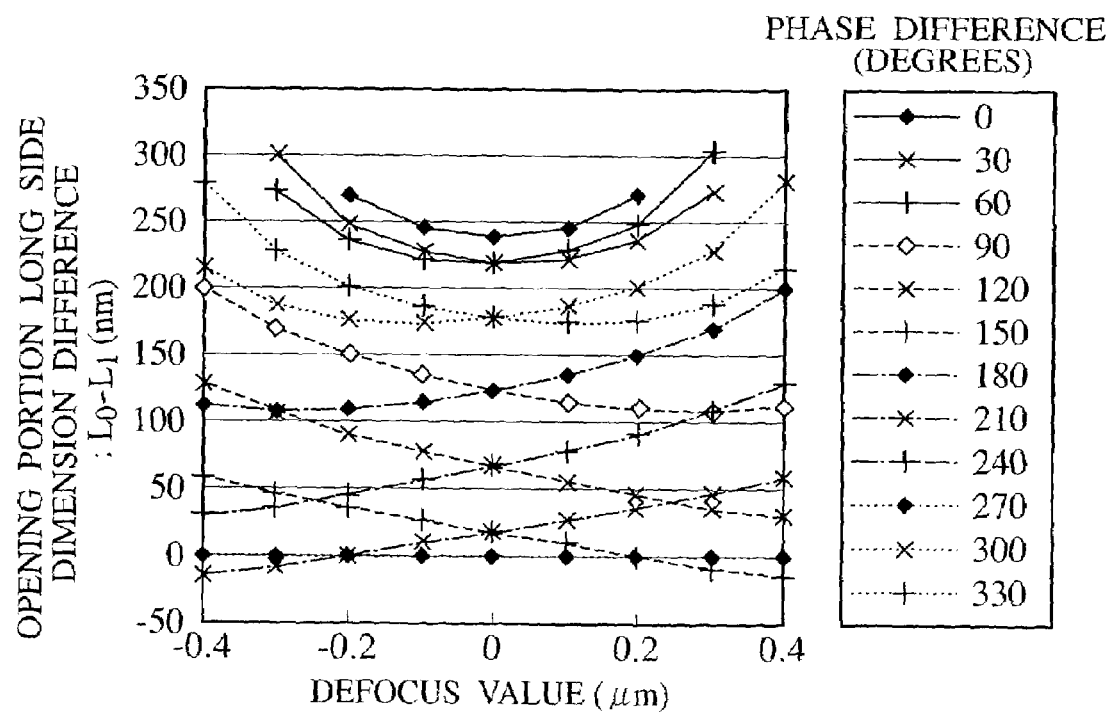
FIG. 5B is a graph showing the relationship between the defocus value and a long side dimension difference (L0–L1) of opening portions, where the phase difference of the first focus monitor pattern 60 according to the first embodiment is used as a parameter.

FIG. 5B is a graph showing the relationship between the defocus value and the dimension difference (L0−L1)

obtained by subtracting the long side dimension L1 of a transferred pattern of the opening portion 60a of the first focus monitor pattern 60 on a wafer from the long side dimension L0 of a transferred pattern of the opening portion 50a of the reference monitor pattern 50 on the wafer. The units of the vertical and horizontal axes are in common with FIG. 5A. The phase difference of the reference monitor pattern 50 is 180 degrees.

When the first focus monitor pattern 60 and the reference monitor pattern 50 have the same phase difference, that is, when the phase difference of the first focus monitor pattern 60 is 180 degrees, exactly the same transferred patterns are formed, and therefore the opening portion long side dimension difference (L0−L1) is approximately zero independently of the defocus value. However, when the phase differences of both the monitor patterns are different from each other, the opening portion long side dimension difference (L0−L1) changes in accordance with the change in the defocus value.

Therefore, each curve shown in FIG. 5B, which shows the relationship between the defocus value and the opening portion long side dimension difference (L0−L1), can be used as a focus calibration curve in the focus monitoring method.

In the case where the photomask shown in FIG. 3A is used in a semiconductor device manufacturing process, when the device pattern 40 is fabricated on a wafer, the transferred patterns of the reference monitor pattern 50 and the first focus monitor pattern 60 can be simultaneously formed on the wafer. Accordingly, the defocus value to be calibrated can be determined based on the focus calibration curve by measuring the opening portion long side dimension difference (L0−L1) for the obtained transferred patterns.

Moreover, as shown in FIG. 5B, when the phase difference of the first focus monitor pattern 60 is used as a parameter, it can be seen that the behavior of the change in the opening portion long side dimension difference (L0−L1) with respect to the defocus value greatly differs depending on the phase difference. Therefore, a focus calibration curve more suitable for monitoring focus can be obtained by optimally setting the phase difference of the first focus monitor pattern 60. Note that the opening portion long side dimension difference for the focus calibration curve may be any of (L0−L1) and (L1−L0).

Such a preferable focus calibration curve includes one in which the value of the dimension difference (L0−L1) greatly changes with respect to the change in the defocus value. Furthermore, a curve showing a monotone increase or decrease change is preferable to one which changes two-dimensionally. If the curve changes two-dimensionally, two values of the defocus value correspond to the same dimension difference (L0−L1), and therefore the defocus value, that is, the defocus direction, cannot be judged uniquely. Moreover, a focus calibration curve with a great change is further preferable. This is because the variation of the defocus value can be detected with higher sensitivity as the change in a focus calibration curve is greater.

Judging from such a point of view, under conditions shown in FIG. 5B, for example, a focus calibration curve which monotonely increases or decreases with respect to the change in the defocus value can be obtained in the cases where the phase difference of the first focus monitor pattern 60 is 90, 120, 150, 210, and 240 degrees. Therefore, these cases are preferable. Particularly in the case where the first focus monitor pattern 60 having a phase difference of 120 degrees is used, when the relationship between the defocus value and the dimension difference (L0−L1) is approximated by a straight line, the slope of the straight line is large. Thus, a high sensitive "focus calibration curve" can be obtained. Note that conditions where the required pattern accuracy can be ensured are adequate for deciding the phase difference of the first focus monitor pattern 60.

The phase difference between the opening portion and the mask portion can be adjusted, for example, by changing the thickness of a region to be the mask portion in a substrate. When a glass substrate is used as the substrate of the photomask, the mask portion is previously etched by dry etching or wet etching using hydrofluoric acid, and the thickness of the glass substrate in this region is thinned to a predetermined thickness, thus making it possible to change the phase difference.

Figure 6:
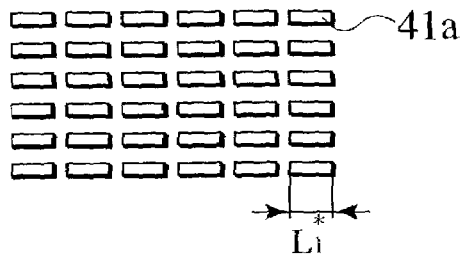
FIG. 6 is a plan view showing an example of another device pattern.

In the above example, the description has been made for the case where the device isolation patterns 40a are prepared as the device pattern 40, but the device pattern 40 is not particularly limited. Various device patterns which are necessary in a semiconductor device process can be the objects thereof. For example, when storage node patterns 41a for a DRAM as shown in FIG. 6 are formed as the device pattern 40, the reference monitor pattern 50 and the first focus monitor pattern 60 which have the same plane shape as the storage node patterns 41a, that is, the same size, pitch, arrangement direction, and the like as well as the same shape, are formed.

When the storage node patterns 41a are formed as the device pattern 40, the phase difference of the reference monitor pattern 50 is set to the same as that between the storage node pattern 41a and the mask portion of the device pattern 40, and the first focus monitor pattern 60 is set to have a phase difference which is different from the above phase difference.

Figure 7A:
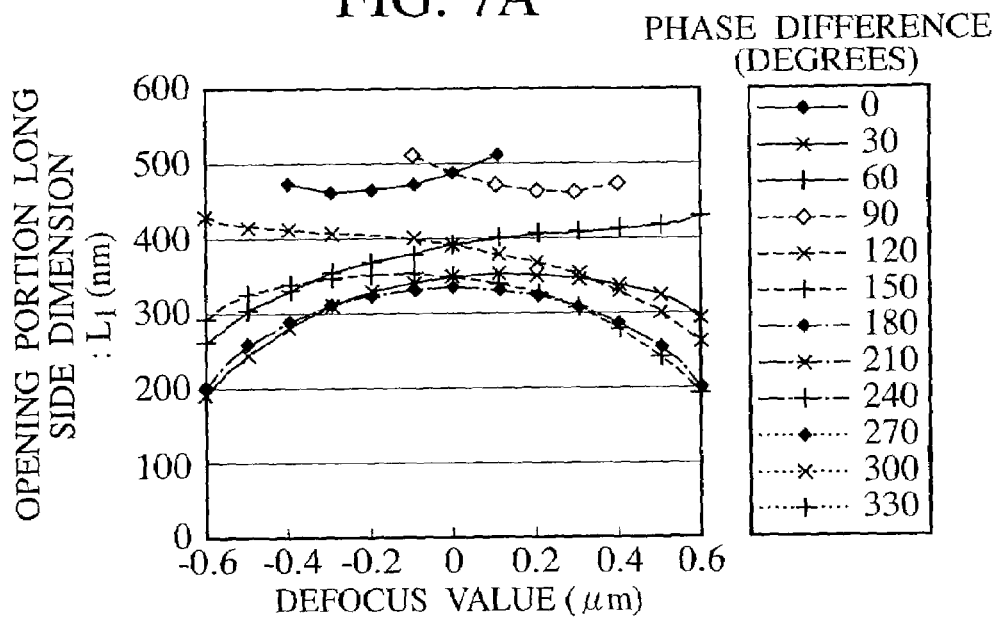
FIG. 7A is a graph showing the relationship between the defocus value and an opening dimension L1, where the phase difference of a first focus monitor pattern 60 according to the first embodiment is used as a parameter.
Figure 7B:
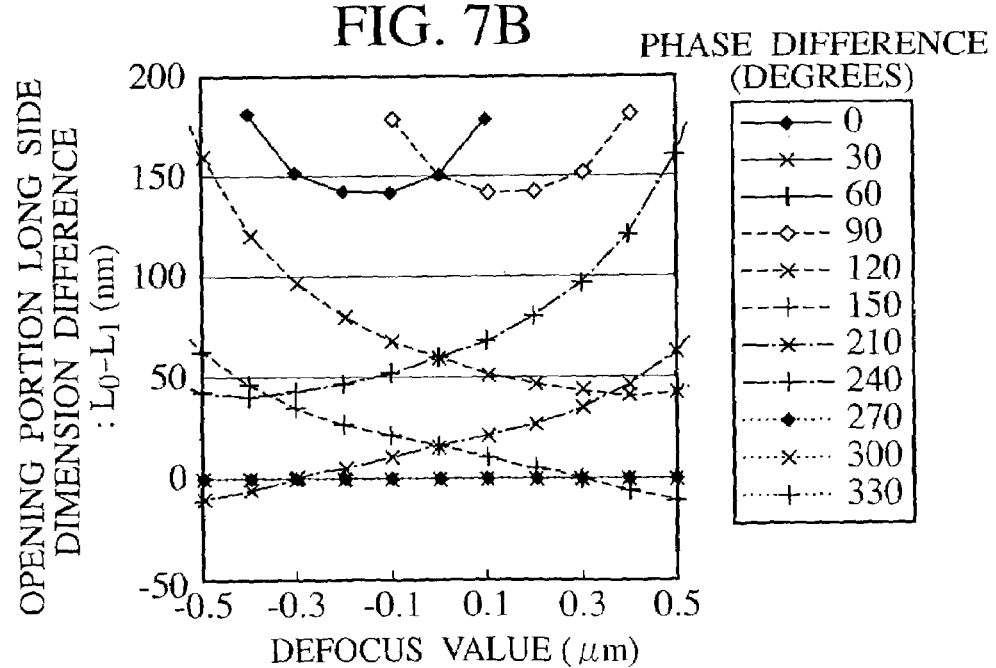
FIG. 7B is a graph showing the relationship between the defocus value and the dimension difference (L1–L0).

FIG. 7A is a graph showing the relationship between the defocus value and the long side dimension L1 of an opening portion of the first focus monitor pattern 60 transferred on a wafer in the case where the storage node patterns 41a are formed as the device pattern 40, which is determined by simulations. On the other hand, FIG. 7B is a graph showing the relationship between the defocus value and the opening portion long side dimension difference (L1−L0) between the transferred first focus monitor pattern 60 and reference monitor pattern 50. In the simulations for both the graphs, the phase difference of the first focus monitor pattern 60 is used as a parameter. Note that the phase difference of the reference monitor pattern 50 is 180 degrees. Moreover, units and the like in the graphs are common to FIGS. 5A and 5B.

As apparent from the graph of FIG. 7A, when the phase difference of the first focus monitor pattern 60 is changed, the long side dimension L1 of the opening portion of the transferred monitor pattern 60 changes.

Moreover, as shown in the graph of FIG. 7B, when the phase difference of the first focus monitor pattern 60 is different from that of the reference monitor pattern 50, the opening portion long side dimension difference (L1−L0) which changes with the change in the defocus value can be obtained. Under the conditions shown in FIG. 7B, in the cases where the phase difference between the opening portion 60a and the mask portion 60b in the first focus monitor pattern 60 is 120, 150, 210 and 240 degrees, a focus calibration curve which monotonely increases or decreases with respect to an increase or decrease of the defocus value can be obtained. Particularly in the case where the first focus monitor pattern 60 having a phase difference of 120 degrees is used, when the relationship between the defocus value and the dimension difference (L1−L0) is approximated by a straight line, the slope of the straight line is large. Thus, a high sensitive "focus calibration curve" can be obtained.

Note that conditions where the required pattern accuracy can be ensured are adequate for deciding the phase difference of the first focus monitor pattern 60.

It is preferred to determine a focus calibration curve for each type of device pattern 40 and to decide the optimum phase difference of the first focus monitor pattern 60 so that the above described conditions can be satisfied.

In the above example, when the dimension difference between a monitor pattern and a device pattern is measured, the size of the long side of an opening portion is measured, but a measurement object is not limited to a long side. It is preferred to set, depending on the shape of each pattern, a portion where a size change is most easily known when defocused as a measurement object.

EXAMPLE

An example of the focus monitoring method in an exposure system using the photomask 10 according to the first embodiment will be described below.

First, using the photomask 10 provided with the reference monitor pattern 50 and the first focus monitor pattern 60 shown in FIG. 3A, a transferred pattern was prepared on a wafer in accordance with the following procedure. Specifically, the pattern was transferred on the wafer, using the photomask which has device isolation patterns as the device pattern and in which the phase differences of the device pattern 40 and the reference monitor pattern 50 are 180 degrees and the phase difference of the first focus monitor pattern 60 is 120 degrees.

With regard to each condition in a photolithography process for transferring, the same conditions as those for preparing the device pattern was used except for the focus condition of the exposure light source.

First, a coating type antireflection film having a thickness of approximately 60 nm was spin-coated on the wafer, and further, on the resultant coated wafer, a chemically amplified positive resist film having a thickness of approximately 200 nm was spin-coated. Next, using the above-described photomask 10 shown in FIG. 3A, the resultant wafer was exposed under the conditions that the demagnification ratio of a projection optical system is 1/4, the wavelength of exposure is 248 nm, the numerical aperture (NA) is 0.68, the coherence factor σ is 0.75, the annular shield factor ε is 0.67, and the set exposure dose is 28 mJ/cm². After exposure, the wafer was post-exposure baked (PEB) at 100° C. for approximately 90 seconds, further immersed in a 0.21 normal alkaline developing solution for 60 seconds, and then developed, thus preparing the transferred pattern on the wafer.

Under the above conditions, the long side dimensions L0 and L1 of the opening portions in the reference monitor pattern 50 and the first focus monitor pattern 60 transferred onto the resist on the wafer were measured using a scanning electron microscope (SEM), thus determining the dimension difference (L1−L0).

Moreover, the exposure position condition, that is, the defocus value condition, was changed, and a transferred pattern was prepared on a wafer in accordance with the same procedure as described above. Then, the opening portion long side dimension difference (L1−L0) was determined for each condition.

Figure 8:
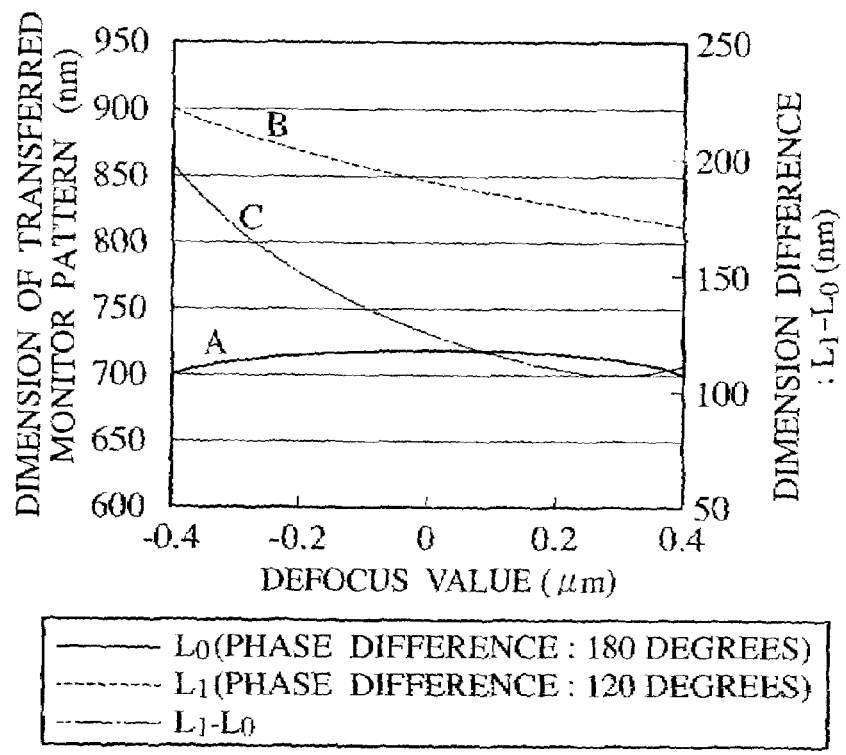
FIG. 8 is a graph showing the relationship between the defocus value and the dimension L1 or L0 of each monitor pattern according to the first embodiment, which is transferred on a wafer, as well as the relationship between the defocus value and the dimension difference (L1–L0).
Figure 9:
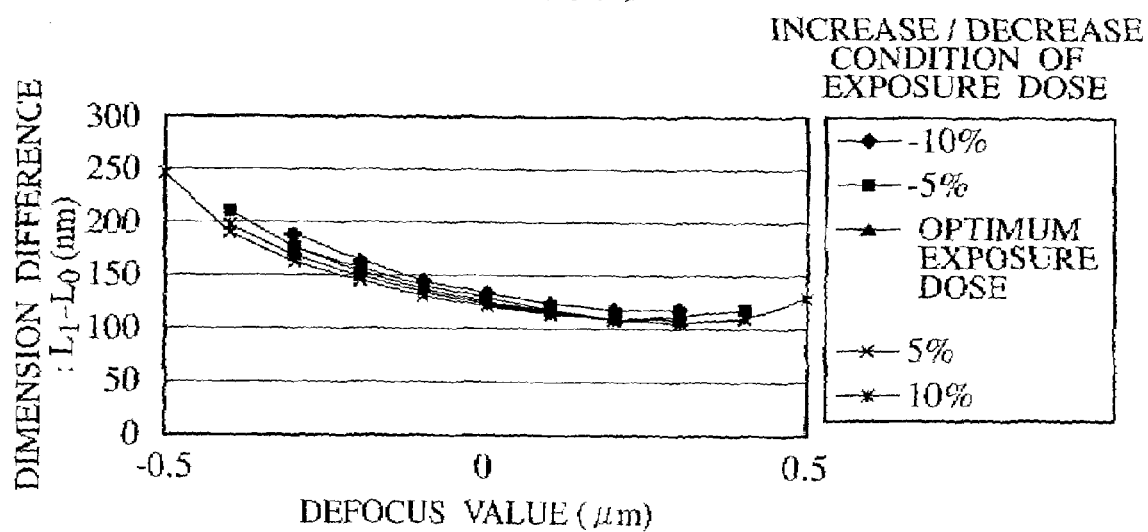
FIG. 9 is a graph showing the influence of exposure dose on the relationship between the defocus value and the dimension difference (L1–L0) of the monitor patterns according to the first embodiment, which are transferred on a wafer.

FIG. 8 shows the relationship between the defocus value and the long side dimension L1 of the opening portion in the first focus monitor pattern 60 transferred on the wafer. Meanwhile, FIG. 9 shows the relationship between the defocus value and the difference of the long side dimension of the opening portion (L1−L0) between the first focus monitor pattern 60 and the reference monitor pattern 50. In FIG. 8, the defocus value is shown on the horizontal axis in units of μm, and the long side dimension (L1) and the dimension difference (L1−L0) are respectively shown on the left and right vertical axes in units of nm.

In FIG. 8, the solid line A shows the relationship between the defocus value and the opening portion long side dimension L0 of the transferred reference monitor pattern 50, that is, the opening portion long side dimension L0 in the case of a phase difference of 180 degrees. The broken line B shows the relationship between the defocus value and the opening portion long side dimension L1 of the transferred first focus monitor pattern 60, that is, the opening portion long side dimension L1 in the case of a phase difference of 120 degrees. Furthermore, the dashed dotted line C shows the opening portion long side dimension difference (L1−L0) between the reference monitor pattern 50 and the first focus monitor pattern 60 (hereinafter simply referred to as the "dimension difference (L1−L0)").

As shown in FIG. 8, the dimension difference (L1−L0) decreases almost monotonely with respect to the variation of the defocus value. Therefore, by using the dashed dotted line C as a focus calibration curve, when the dimension difference (L1−L0) is measured, the defocus value and the defocus direction (minus direction or plus direction) can be known. Moreover, since the change (slope) of this focus calibration curve is large, it has been confirmed that focus monitoring with high sensitivity can be performed.

<Influence of Exposure Dose>

Next, in the focus monitoring method using the photomask 10 according to the first embodiment, a check was made as to the influence of the variation in the case where the exposure dose of an exposure system is changed. Specifically, a check was made as to how the relationship between the defocus value and the above-described dimension difference (L1−L0) changes when the exposure dose is changed. To be more precise, the exposure dose was changed from −10% to +10% of 28 mJ/cm² as the center, which is the optimum exposure dose and, for each of these exposure conditions, the photomask pattern was transferred on a wafer under the above-described conditions. The relationship between the defocus value and the dimension difference (L1−L0) under each exposure condition was determined. The result thereof is shown in FIG. 9.

The graph in FIG. 9 shows the relationship between the defocus value and the dimension difference (L1−L0) when the exposure dose is changed in the range from −10% to +10% of 28 mJ/cm², which is set as the center and the optimum exposure dose. It has been confirmed that, even when the exposure dose is changed from −10% to +10%, the relationship between the defocus value and the dimension difference (L1−L0) hardly changes. Therefore, it has been confirmed that, according to the focus monitoring method using the photomask of the first embodiment, even if the exposure dose varies, the positional deviation amount from the focus can be detected with high accuracy.

In the case where a focus monitor pattern having different size and shape from the device pattern is used, when the exposure dose varies, different influences may occur in the transferred device pattern and focus monitor pattern. Therefore, it is difficult to perform accurate focus monitoring based on the focus pattern. However, in the focus monitoring method according to the first embodiment, since the focus monitor pattern has the same plane pattern shape as the device pattern, almost the same influences occur in both the patterns in response to the variation in the exposure dose and the influences are counteracted. Accordingly, even if the variation in the exposure dose exists, accurate focus monitoring can be performed.

<Influence of Lens Aberration>

Next, in the focus monitoring method using the photomask according to the first embodiment, a check was made as to the influence of a lens aberration of an exposure system. Using Zernike polynomials which are widely used to represent a lens aberration, a check was made as to focus monitor sensitivity when there is an aberration of a certain magnitude for each term. Note that Zernike polynomials are described in detail, for example, in "Applied optics and optical engineering, vol. XI (Academic Press, San Diego USA, 1992)" edited by R. Shannon and J. Wyant, the entire contents of this reference being incorporated herein by reference.

Figure 10A:
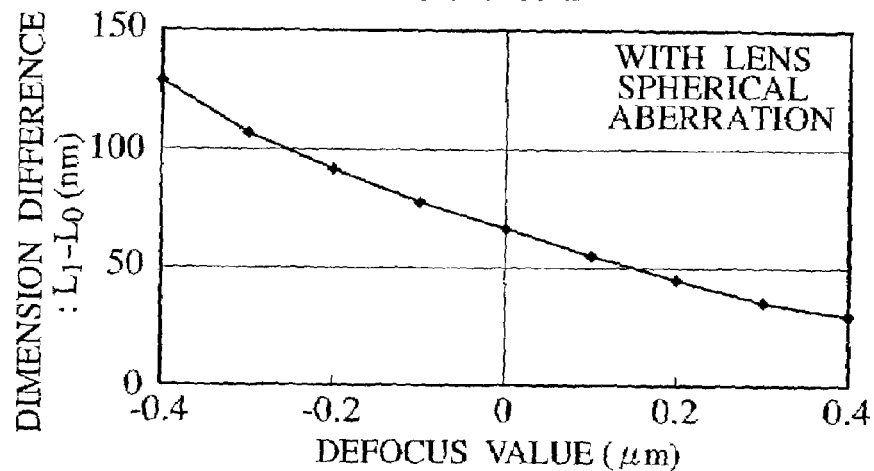
FIGS. 10A to 10C are graphs showing the influence of a lens aberration on the relationship between the defocus value and the dimension difference (L1–L0) of the monitor patterns according to the first embodiment, which are transferred on a wafer.

FIG. 10A shows the relationship between the defocus value and the dimension difference (L1−L0) under the conditions where a spherical aberration exists in a lens, which is determined by simulations. Specifically, FIG. 10A is a graph showing the relationship between the defocus value and the dimension difference (L1−L0) when a transferred pattern is prepared for each of the reference monitor pattern 50 and the first focus monitor pattern 60 using a lens in which an aberration of 0.05 λ is deliberately added only for the spherical aberration of the ninth term in Zernike polynomials.

The solid line shown in the graph of FIG. 10A is a monotone increasing function and is confirmed to be suitable for a focus calibration curve for monitoring focus. Note that, when the monotone increasing function is approximated by a straight line and the slope thereof is determined, the value of the slope is approximately 118 nm/μm.

Figure 10B:
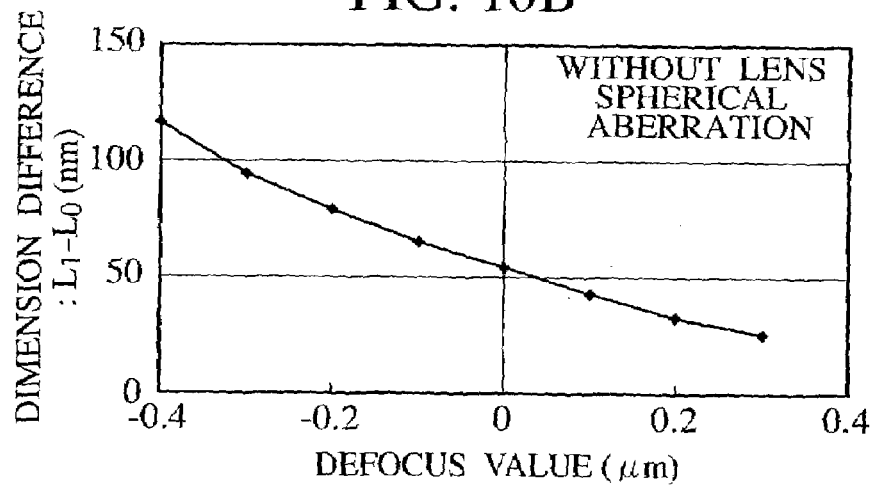

FIG. 10B shows the relationship between the defocus value and the dimension difference (L1−L0) in the case of no lens aberration, which is determined by simulations. In this case, the slope of the monotone increasing function shown by the solid line is approximately 120 nm/μm. Specifically, from the comparison of FIGS. 10A and 10B, the change in the slope of the approximation line of the focus calibration curve, which shows the relationship between the defocus value and the dimension difference (L1−L0), due to the presence or absence of a lens aberration has been confirmed to be very small.

Figure 10C:
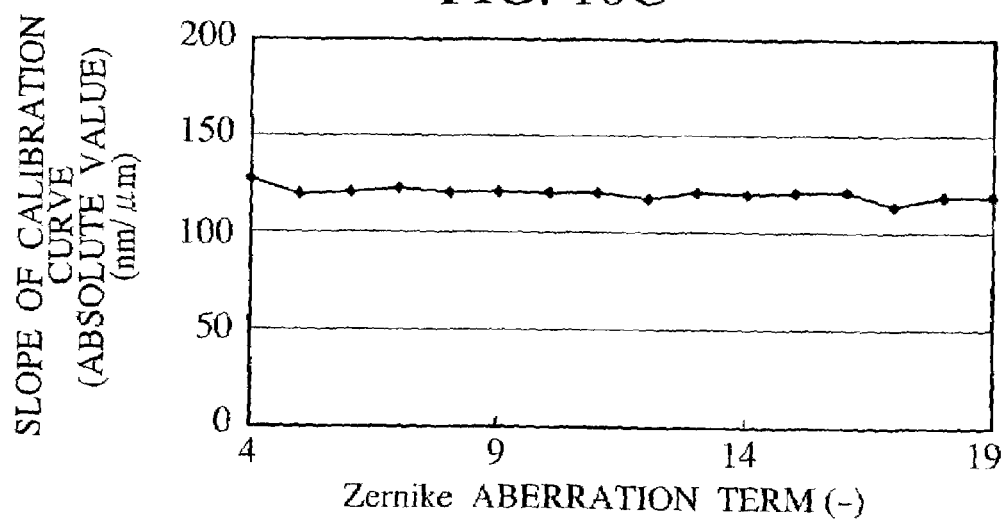

Moreover, FIG. 10C is a graph obtained by determining the relationship between the defocus value and the dimension difference (L1−L0) for each case where there is a lens aberration for each term from first to sixteenth terms of Zernike polynomials and further by determining the slope of each monotone increasing function similarly to FIG. 10A. Each aberration term of Zernike is shown on the horizontal axis, and the absolute value of the slope is shown on the vertical axis.

With an aberration of any term, the absolute value of the slope is almost a constant value and significant change cannot be seen. From this result, it has been confirmed that, according to the focus monitoring method using the photomask of the first embodiment, even if an aberration exists in a lens of an exposure system, high sensitive focus monitoring can be performed without the influence of the lens aberration.

In the case where a focus monitor pattern having different size and shape from the device pattern is used, when a lens aberration exists in an exposure light source, different influences may occur in the transferred device pattern and focus monitor pattern. Therefore, it is difficult to perform accurate focus monitoring based on the focus monitor pattern. However, it has been confirmed that, since the focus monitor pattern has the same plane pattern shape as the device pattern in the focus monitoring method according to the first embodiment, almost the same influences occur in both the patterns even when any lens aberration exists, and therefore the influences are counteracted, thus making it possible to perform accurate focus monitoring.

As described above, the photomask according to the first embodiment of the present invention comprises the reference monitor pattern 50 having the same phase difference condition as the device pattern 40 and the first focus monitor pattern 60 having a different phase difference from the device pattern 40. Accordingly, by measuring the dimension difference (L1−L0) between the reference monitor pattern 50 and the first focus monitor pattern 60 transferred on a wafer, the defocus value can be detected.

In addition, by selecting the phase difference of the first focus monitor pattern 60, high sensitivity focus monitoring can be performed. Thus, the focus condition can be adjusted with high accuracy.

Since the device pattern 40, the reference monitor pattern 50, and the first focus monitor pattern 60 on the photomask have the same plane pattern shape, the difference in the influences of a lens aberration and exposure dose of an exposure system can be eliminated almost completely. Therefore, if the focus monitoring method according to the first embodiment is used, it is possible to perform accurate focus monitoring without being influenced by a lens aberration and exposure dose.

Although the first embodiment of the present invention and the example thereof have been described above, it is apparent to those skilled in the art that, in the photomask according to the first embodiment of the present invention, the opening portions and the mask portion may be reversed to make a photomask pattern for negative resist.

Furthermore, in the above-described photomask according to the first embodiment, the reference monitor pattern 50 having the same phase difference as the device pattern 40 is located adjacent to the first focus monitor pattern 60. However, the locations of these patterns are not particularly limited. Note that, if these two monitor patterns are located adjacent to each other, SEM measurement or the like can be conveniently performed when the dimensions L1 and L0 of the patterns are measured.

Figure 11A:
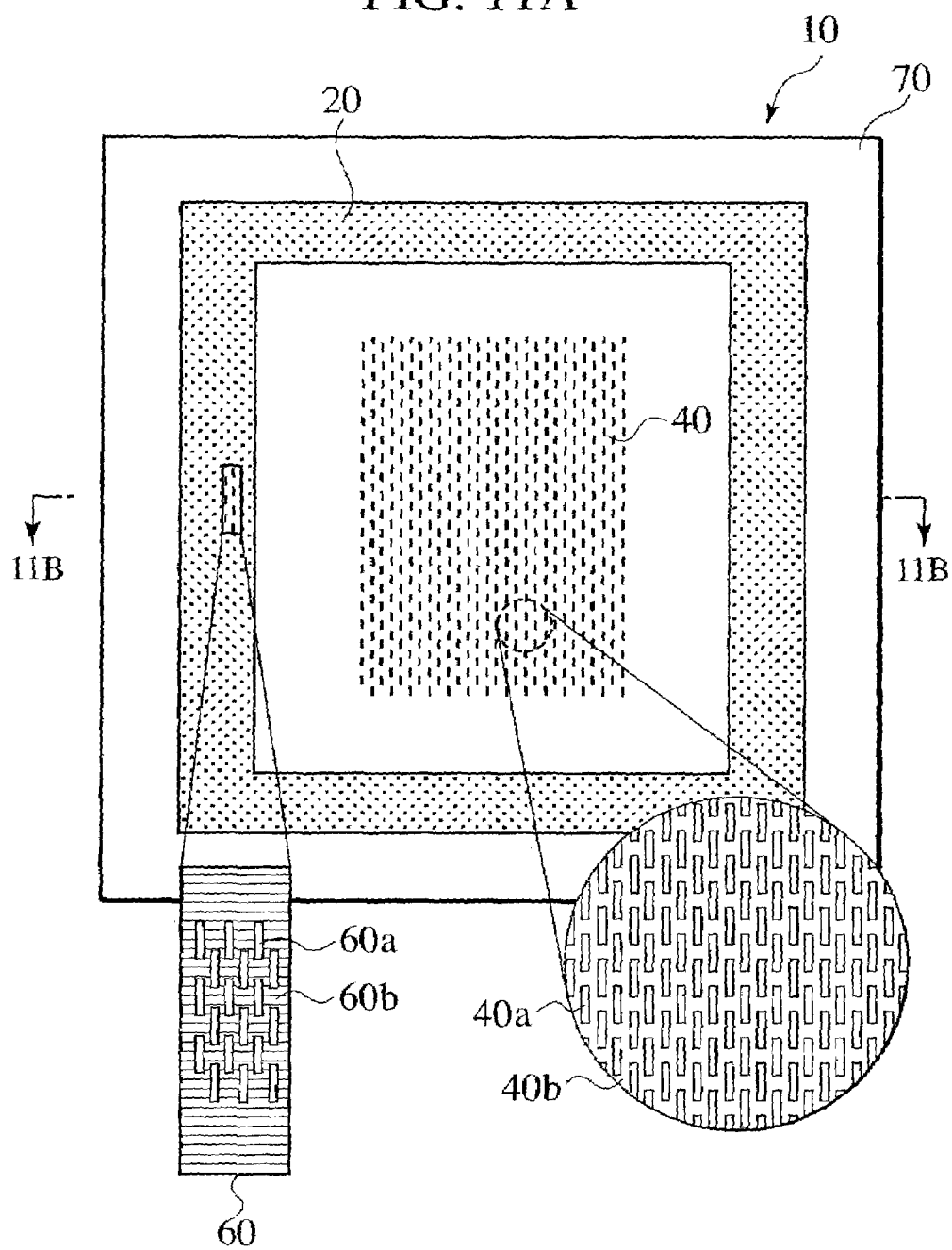
FIG. 11A is a plan view showing another photomask according to the first embodiment.
Figure 11B:
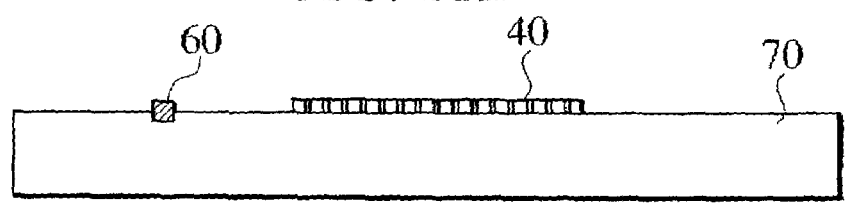
FIG. 11B is a cross-sectional view thereof.

Incidentally, since the reference monitor pattern 50 has the same plane pattern shape and phase condition as the device pattern 40, the opening portion long side dimension L of the device pattern 40 can be directly set as the measurement object without using the reference monitor pattern 50. In this case, as shown in FIGS. 11A and 11B, a photomask in which the reference monitor pattern 50 is removed from the photomask shown in FIGS. 3A and 3B can be used.

Second Embodiment

A photomask according to a second embodiment has a basic structure in common with the photomask according to the first embodiment. The photomask of the second photomask comprises two types of focus monitor patterns having the same pattern as a device pattern similarly to the case of the photomask according to the first embodiment shown in FIGS. 3A and 3B, outside a device pattern formation region, for example, in a dicing region. The main feature of the photomask according to the second embodiment is that the respective phase differences of first and second focus monitor patterns 62 and 52 as the two types of focus monitor patterns are set so as to have opposite signs.

Figure 12A:
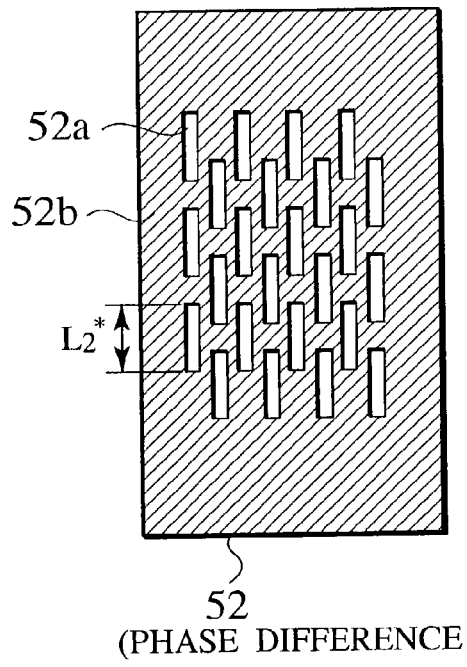
FIG. 12A is a plan view of a focus monitor pattern having a phase difference of –120 degrees, which is formed on a photomask according to a second embodiment.
Figure 12B:
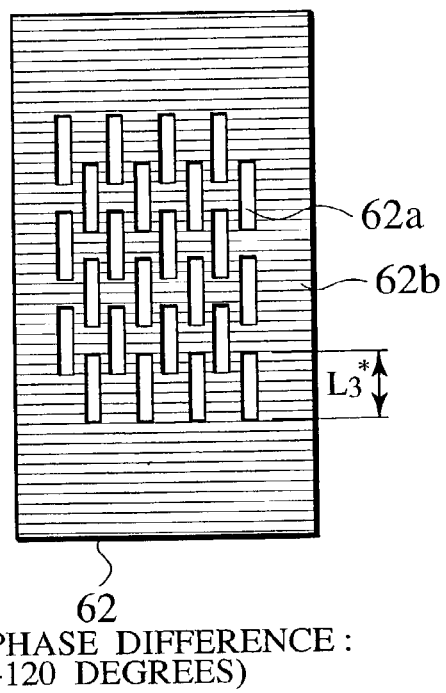
FIG. 12B is a plan view of a focus monitor pattern having a phase difference of +120 degrees, which is formed on the photomask according to the second embodiment.

FIGS. 12A and 12B are plan views of the first and second focus monitor patterns 62 and 52 according to the second embodiment. For example, when the phase difference in transmitted exposure light between an opening portion 62a and a mask portion 62b of the first focus monitor pattern 62 is +120 degrees, the phase difference in the transmitted exposure light between an opening portion 52a and a mask portion 52b of the second focus monitor pattern 52 (such a phase difference is hereinafter simply referred to as a "phase difference") is set to −120 degrees. The long side dimensions of the opening portions 52a and 62a on the mask are L*2 and L*3, respectively. Here, the case where device isolation region patterns are used as the device pattern is shown, but the device pattern is not limited to this.

To be more precise, for example, the mask portion 62b of the first focus monitor pattern 62 has a transmittance of 6% for exposure light and has an effect of shifting the phase of the exposure light transmitted therethrough by +120 degrees relative to that of the exposure light transmitted through the opening portions 62a. On the other hand, the mask portion 52b of the second focus monitor pattern 52 has a transmittance of 6% for the exposure light and has an effect of shifting the phase of the exposure light transmitted therethrough by −120 degrees relative to that of the exposure light transmitted through the opening portions 52a. Note that the phase shift of −120 degrees is an equivalent condition to the phase shift of +240 degrees.

Figure 13:
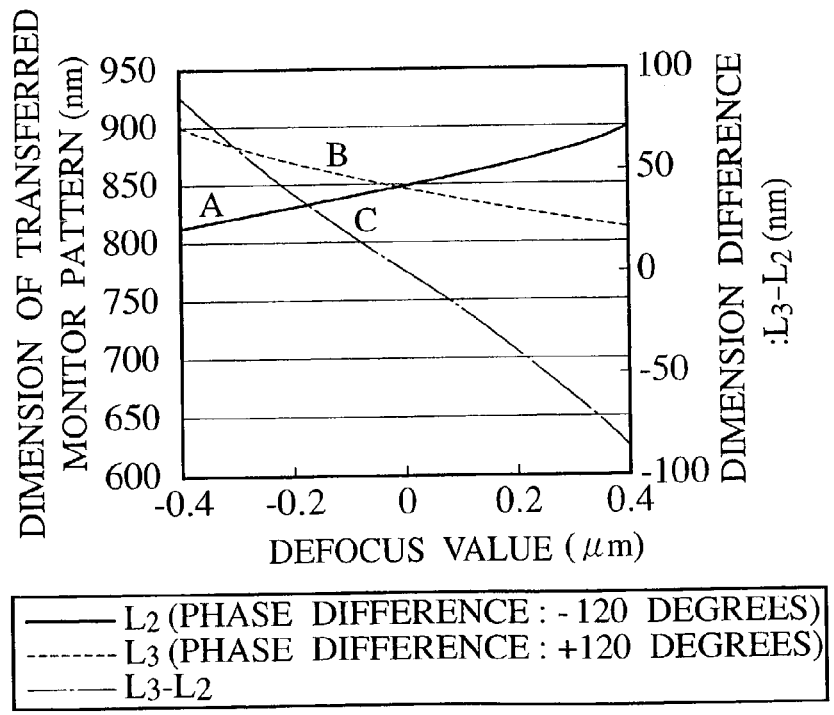
FIG. 13 is a graph showing the relationship between the defocus value and the dimension L2 or L3 of each monitor pattern according to the second embodiment, which is transferred on a wafer as well as the relationship between the defocus value and the dimension difference (L3–L2).

FIG. 13 is a graph showing the relationships between the defocus value and each of the opening portion long side dimensions L3 and L2 and the dimension difference thereof (L3−L2) regarding the first and second focus monitor patterns 62 and 52, which are transferred on a wafer under the conditions shown in the first embodiment using the photomask according to the second embodiment. The defocus value is shown on the horizontal axis in units of µm. The opening portion long side dimension L2 or L3 is shown on the left vertical axis and the dimension difference (L3−L2) is shown on the right vertical axis in units of nm.

The solid line A shows the relationship between the defocus value and the long side dimension L2 of the opening portion transferred on the wafer by the second focus monitor pattern 52 having a phase difference of −120 degrees. The broken line B shows the relationship between the defocus value and the long side dimension L3 of the opening portion transferred on the wafer by the first focus monitor pattern 62 having a phase difference of +120 degrees. Furthermore, the dashed dotted line C shows the relationship between the defocus value and the opening portion long side dimension difference (L3−L2) between the first and second focus monitor patterns 62 and 52.

Thus, when the values of the phase differences in two types of monitor patterns are set so as to have the same absolute values and opposite signs, there is a relationship in which increasing and decreasing to the defocus value are opposite in the opening portion long side dimensions L2 and L3 of the transferred pattern. Therefore the change in the dimension difference (L3−L2) with respect to the change in the defocus value can be large. Accordingly, in the focus monitoring method, when the relationship between the defocus value and this dimension difference (L3−L2) is used as a focus calibration curve and approximated by a straight line, a large slope can be obtained when approximated by the straight line, thus enabling high sensitive focus monitoring.

For example, the slope of a straight line in the case where the focus calibration curve is approximated by the straight line is twice as large as the case of the first embodiment shown in FIG. 8, and it can be seen that monitor sensitivity has been significantly improved.

Thus, in the focus monitoring method using the photomask according to the second embodiment, it is possible to further improve the sensitivity of the focus monitoring method using the photomask according to the first embodiment.

Note that, though the phase differences of the first and second focus monitor patterns 62 and 52 are respectively set to +120 and −120 degrees here, various phase differences can be set depending on the accuracy of a pattern to be formed. For example, referring to the graph of FIG. 5A, phase differences having the relationship in which the increase and decrease of the change in the opening portion long side dimension L1 with respect to the change in the defocus value are opposite to each other, can be selected, such as a combination of 90 and 270 degrees, +90 and −90 degrees, 150 and 210 degrees, that is, +150 and −150 degrees, or the like.

With regard to the concrete procedure for monitoring focus, the similar method to that according to the first embodiment can be adopted. Moreover, not only the device isolation region pattern but also various patterns can be applied as the device pattern.

Also in the focus monitoring method using the photomask according to the second embodiment, similarly to the case of the first embodiment, since the device pattern 40 and the first and second focus monitor patterns 62 and 52 on the photomask have the same plane pattern shape, the difference in the influences of a lens aberration and exposure dose of an exposure system can be eliminated almost completely. Therefore, if the focus monitoring method according to the second embodiment is used, it is possible to perform accurate focus monitoring without being influenced by a lens aberration and the exposure dose.

Third Embodiment

A photomask according to a third embodiment has two types of monitor patterns for use in monitoring exposure dose.

Figure 14A:
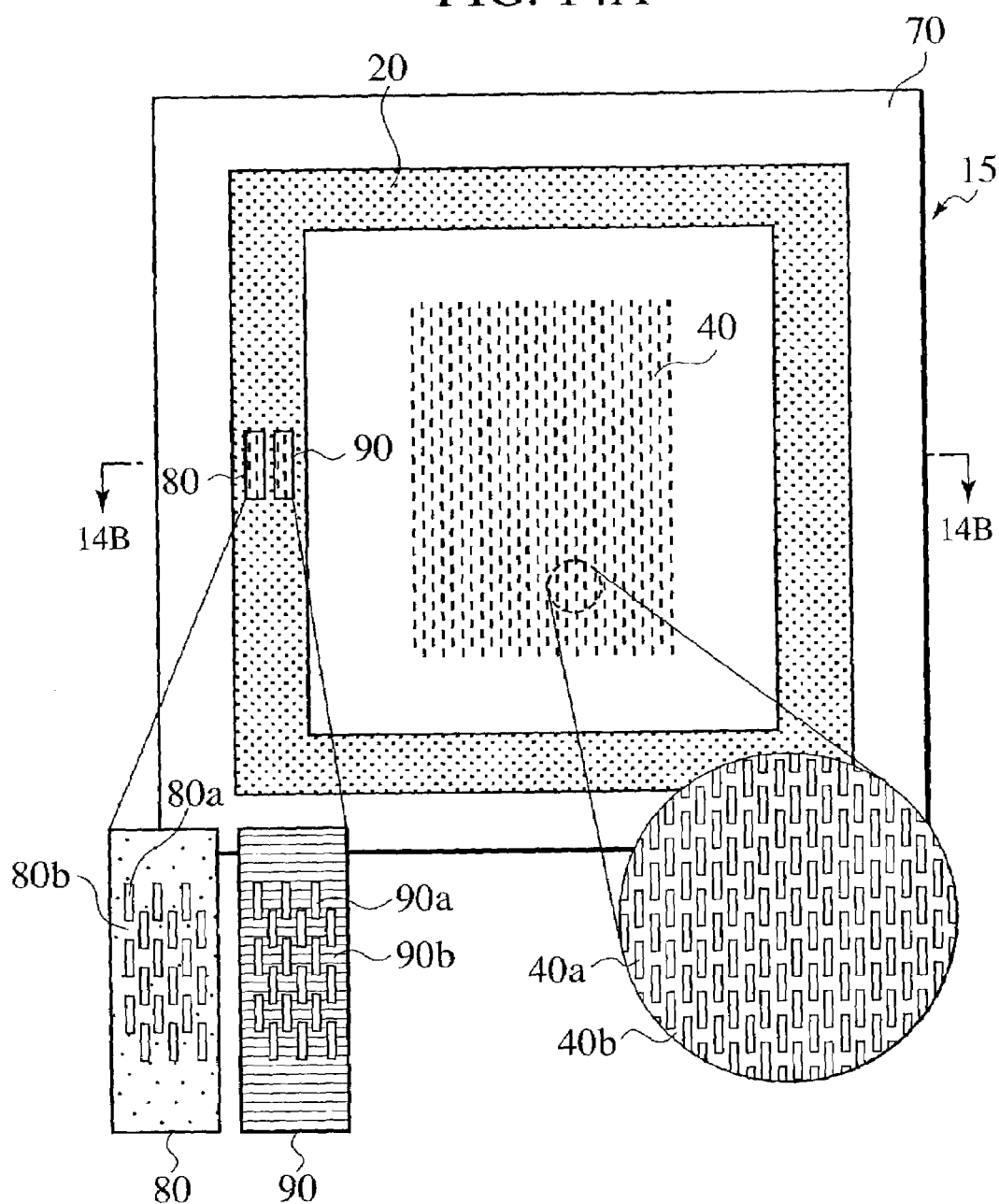
FIG. 14A is a plan view showing a photomask according to a third embodiment.
Figure 14B:
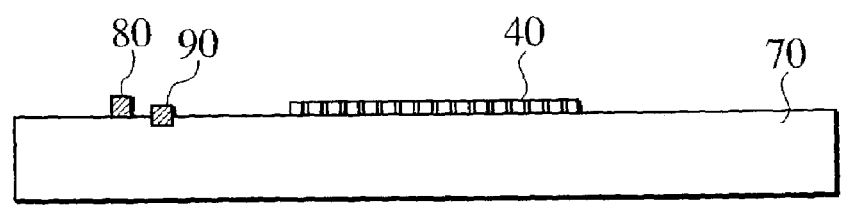
FIG. 14B is a cross-sectional view thereof.

FIG. 14A shows a partial enlarged plan view of the photomask 15 according to the third embodiment, and FIG. 14B shows a cross-sectional view taken along the break line 14B—14B. The photomask 15 has a basic structure in common with the photomask according to the first embodiment shown in FIGS. 3A and 3B. The photomask 15 has the reference monitor pattern 80 and the exposure dose monitor pattern 90 which have the same plane pattern shape as a device pattern 40, outside the device pattern 40, for example, in a region 20 corresponding to a dicing region on a wafer. These two types of monitor patterns, that is, the reference monitor pattern 80 and the exposure dose monitor pattern 90, are patterns for monitoring exposure dose of light irradiated from an exposure system onto a wafer. Note that, though a device isolation region pattern will be exemplified as an example of the device pattern 40 here, the device pattern 40 is not particularly limited to this.

Figure 15A:
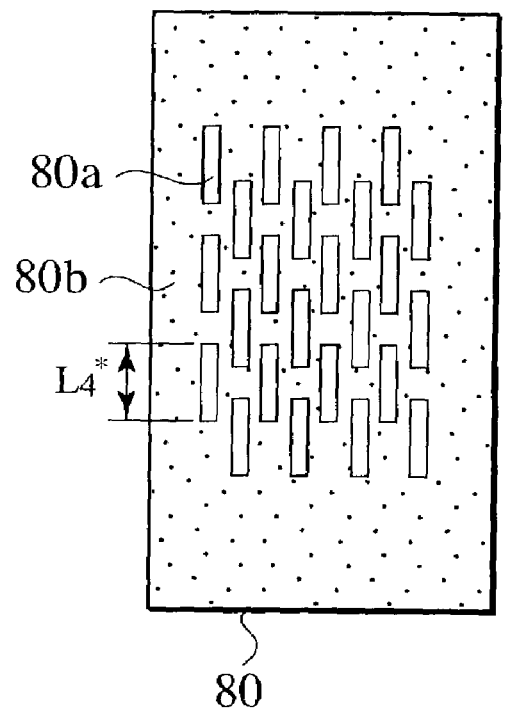
FIGS. 15A and 15B are plan views of monitor patterns formed on the photomask according to the third embodiment.
Figure 15B:
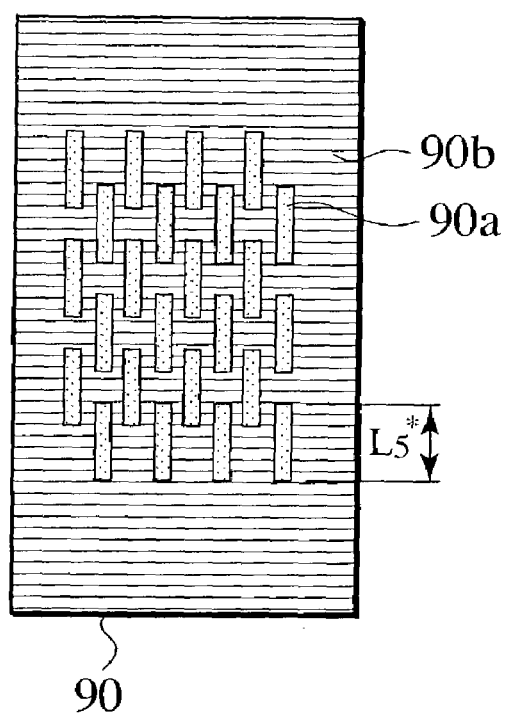

In FIGS. 15A and 15B, plan views of the reference monitor pattern 80 and the exposure dose monitor pattern 90 are shown. The reference monitor pattern 80 and the exposure dose monitor pattern 90 have the same plane pattern shapes as a partial pattern of the device pattern 40. Specifically, unit opening portions 80a and 90a having the same shape and size as a device isolation pattern 40a are arranged at the same pitch and in the same direction as the device isolation pattern 40a. The long side dimensions of the opening portions 80a and 90a on a wafer are L*4 and L*5, respectively.

The region sizes of the reference monitor pattern 80 and the exposure dose monitor pattern 90 are set so that pattern transfer conditions, that is, conditions in a series of photolithography processes including resist forming, exposure, and development, may be almost the same as those for the device pattern 40.

Moreover, the phase difference in transmitted exposure light between each opening portion and a mask portion in both of the reference monitor pattern 80 and the exposure dose monitor pattern 90 is the same as that between each opening portion and the mask portion in the device pattern 40.

The characteristic point is that the opening portions 80a of the reference monitor pattern 80 have the same transmittance as the opening portions 40a of the device pattern 40, whereas the opening portions 90a of the exposure dose monitor pattern 90 have a different transmittance from that thereof. For example, when the opening portions 80a of the reference monitor pattern 80 have a transmittance of 100% for exposure light, the opening portions 90a of the exposure dose monitor pattern 90 have a transmittance of 98 to 84% for the exposure light.

Figure 16:
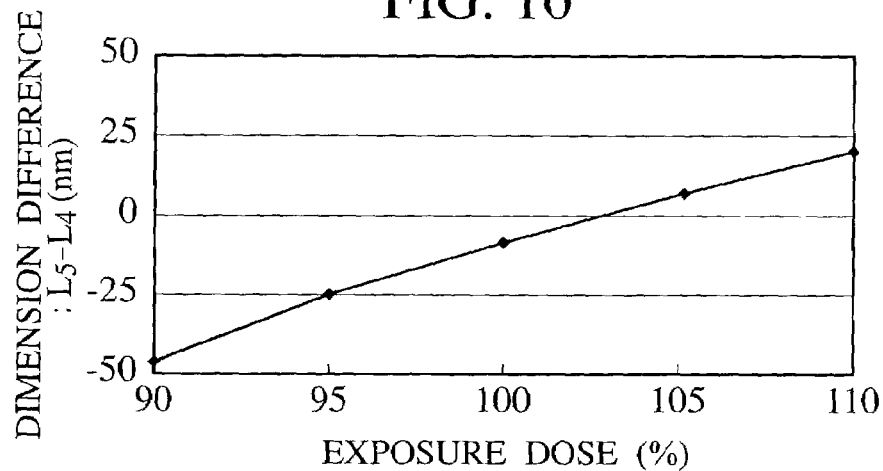
FIG. 16 is a graph showing the relationship between the exposure dose and the dimension difference (L5–L4) of the monitor patterns according to the third embodiment.

FIG. 16 is a graph showing the relationship between exposure dose and the dimension difference (L5–L4) determined based on the result of measuring the opening portion long side dimensions L4 and L5 of the reference monitor pattern 80 and the exposure dose monitor pattern 90 transferred on a wafer by use of a SEM, after forming a transferred pattern on a wafer by use of the photomask 15 according to the third embodiment while changing an exposure dose condition. The dimension difference (L5–L4) is shown on the vertical axis in units of nm, and the exposure dose is shown on the horizontal axis in units of %. Note that, as basic conditions for transferring a pattern, the conditions in the example of the first embodiment are used.

As apparent from FIG. 16, between the exposure dose and the dimension difference (L5–L4), there is a correlation that can be almost approximated by a straight line. Therefore, it can be seen that the variation in the exposure dose can be monitored by measuring the dimension difference (L5–L4) between the opening portion 80a of the reference monitor pattern 80 and the opening portion 90a of the exposure dose monitor pattern 90. Specifically, the line in the graph showing the relationship between the exposure dose and the dimension difference (L5–L4) can be used as an exposure dose calibration curve in an exposure dose monitoring method.

When the device pattern 40 is fabricated on a wafer using the photomask 15 shown in FIG. 14A in a semiconductor device manufacturing process, transferred patterns of the reference monitor pattern 80 and the exposure dose monitor pattern 90 can be simultaneously formed on the wafer. Accordingly, by measuring the opening portion long side dimension difference (L5–L4) of the obtained transferred patterns, the variation value of the exposure dose can be determined based on the exposure dose calibration curve.

Figure 17:
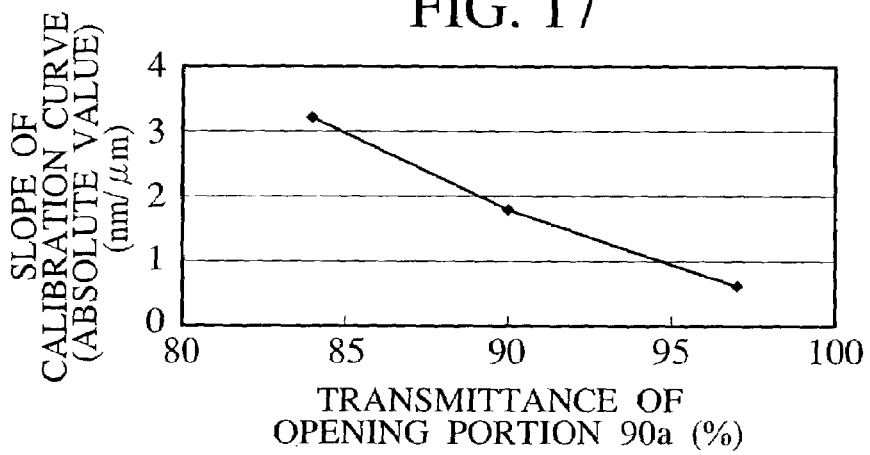
FIG. 17 is a graph showing the relationship between the slope of an exposure dose calibration curve and an opening portion transmittance of the monitor pattern 90 according to the third embodiment.

FIG. 17 is a graph showing the relationship between the transmittance of the opening portion 90a in the exposure dose monitor pattern 90 and the absolute value of the slope when the exposure dose calibration curve is approximated by a straight line. Note that the transmittance of the opening portion 80a in the reference monitor pattern 80 is 100%.

In order to perform exposure dose monitoring with higher sensitivity, a higher absolute value of the slope of the exposure dose calibration curve is preferable. According to FIG. 17, it can be seen that, as the transmittance of the opening portion 90a in the exposure dose monitor pattern 90 is lowered, the absolute value of the slope becomes larger and the sensitivity becomes higher. However, if the transmittance of the opening portion 90a is lower than 84% in the case where a fine device isolation region pattern having a pitch of approximately 130 nm is formed, the contrast between the opening portion 90a and a mask portion 90b is insufficient, and the transferred pattern cannot be even resolved. Therefore, it is preferable to lower the transmittance of the opening portion 90a for the exposure light within a range in which a sufficient pattern resolution can be obtained, that is, within a range in which a transferred pattern having a sufficient contrast can be formed. Accordingly, when the transmittance of the opening portion of the reference monitor pattern 80 is 100%, it can be said that the opening portion transmittance of the exposure dose monitor pattern 90 is preferably from 84% to 98% inclusive, more preferably, from 90% to 95% inclusive. Note that the transmittances of the opening 40a in the device pattern 40 and the opening 80a in the reference monitor pattern 80 are not limited to 100%. The difference in the exposure light transmittance between the reference monitor pattern 80 and the exposure dose monitor pattern 90 is preferably from 2 to 16%, more preferably, from 5 to 10%.

<Dependency on Defocus>

Figure 18:
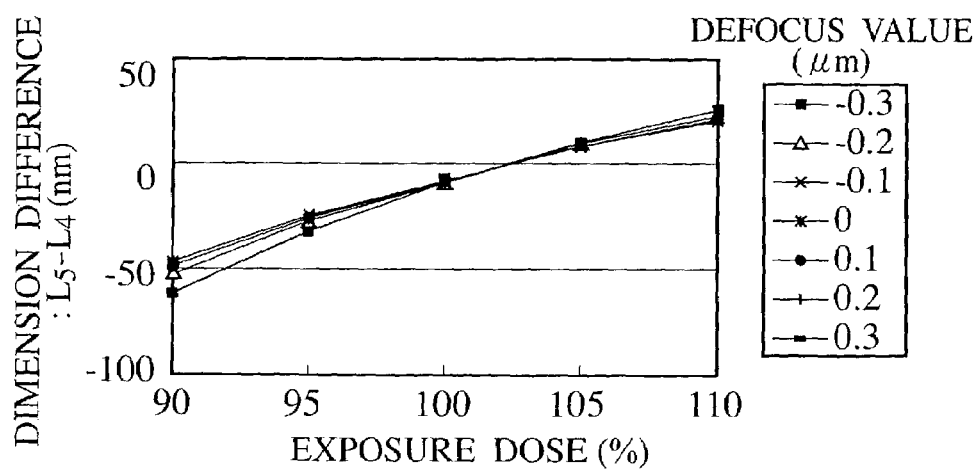
FIG. 18 is a graph showing the influence of the defocus on the relationship between the exposure dose and the dimension difference (L5−L4) of the monitor patterns according to the third embodiment.

FIG. 18 is a graph showing the influence when defocus (focus position deviation) occurs in the exposure dose monitoring method using the photomask according to the third embodiment. The exposure dose is shown on the horizontal axis, and the dimension difference (L5–L4) is shown on the vertical axis. When the defocus value is changed from +0.3 μm to −0.3 μm, the lines showing the relationship between the exposure dose and the dimension difference (L5–L4) overlap each other as shown in this graph. From this result, it has been confirmed that the variation value of the exposure dose can be accurately monitored without depending on the defocus value when the exposure dose monitoring method according to the third embodiment is used.

Similarly to the case of the first embodiment, in the exposure dose monitoring method according to the third embodiment, since the exposure dose monitor pattern has the same plane pattern shape, phase difference, and so forth as the device pattern, almost the same influences occur in both the patterns in response to the variation in the defocus value, and the influences are counteracted. Accordingly, even if the variation in the defocus value exists, accurate exposure dose monitoring can be performed.

<Influence of Lens Aberration>

Figure 19:
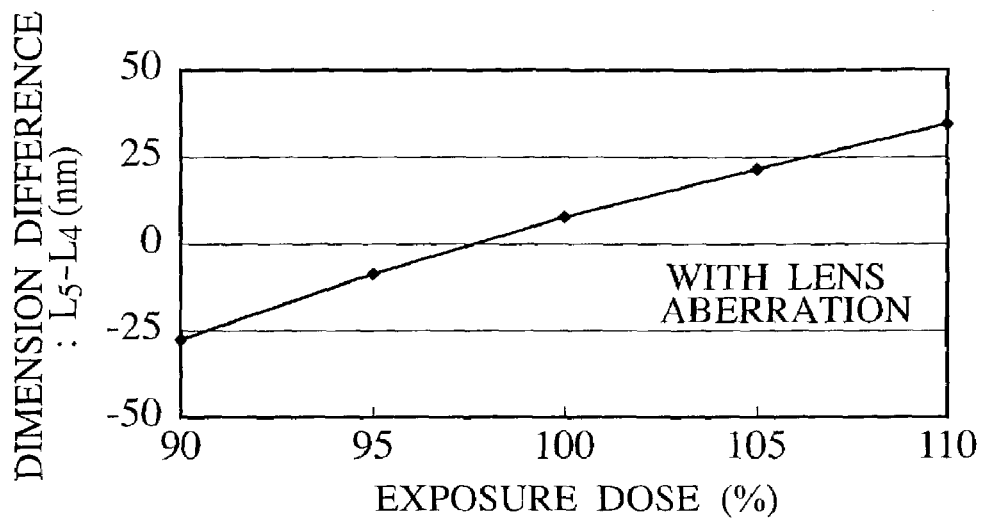
FIG. 19 is a graph showing the influence of a lens aberration of an exposure system on the relationship between the exposure dose and the dimension difference (L5−L4) of the monitor patterns according to the third embodiment.

FIG. 19 is a graph showing the influence of a lens aberration of an exposure system in the exposure dose monitoring method using the photomask according to the third embodiment. This graph shows the relationship between the exposure dose and the dimension difference (L5–L4) under the conditions where a spherical aberration exists as described in the first embodiment, which is obtained by simulations. Specifically, FIG. 19 is a graph showing the relationship between the exposure dose and the dimension difference (L5–L4) when transferred patterns are prepared for both the reference monitor pattern 80 and the exposure dose monitor pattern 90 using a lens in which an aberration of 0.05 λ is deliberately added only for the spherical aberration of the ninth term in Zernike polynomials. The solid line shown in the graph of FIG. 19 is almost a monotone increasing function. The monotone increasing function has almost the same slope as the graph of FIG. 16 determined under the condition with no lens aberration. From this result, it can be confirmed that exposure dose monitoring with high sensitivity can be performed even when a lens aberration exists.

Figure 20:
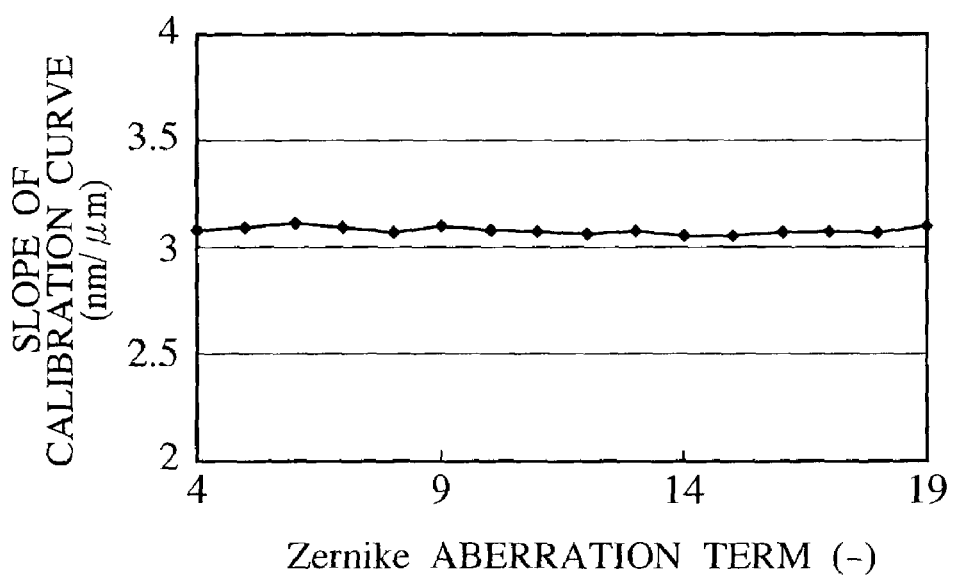
FIG. 20 is a graph showing the influence of each Zernike aberration of a lens on the slope of the exposure dose calibration curve according to the third embodiment.

In the graph shown in FIG. 20, the horizontal axis shows the terms of Zernike aberration, that is, types of aberration, and the vertical axis shows absolute value of the slope when the exposure dose calibration curve is approximated by a straight line. As expected from this graph, the slope hardly changes depending on the types of aberration. Specifically, according to the exposure dose monitoring method of the third embodiment, even when a certain aberration exists in a lens of an exposure system, the exposure dose can be monitored without being influenced by the aberration.

Similarly to the case of the first embodiment, in the photomask according to the third embodiment, the exposure dose monitor pattern has the same plane pattern shape and phase difference condition as the device pattern. Accordingly, when any lens aberration exists, almost the same influences occur in both the patterns. Therefore, the influences are counteracted, thus enabling accurate focus monitoring.

As described above, according to the exposure dose monitoring method of the third embodiment, two types of monitor patterns having different opening portion transmittances are used, and the dimension differences (L5–L4) of transferred patterns are determined, thus making it possible to determine the variation value of the exposure dose.

Incidentally, since the reference monitor pattern 80 has the same conditions as the device pattern 40, the opening portion long side length L of the device pattern 40 may be directly measured instead of the opening portion long side length L4 of the reference monitor pattern 80. In this case, in the photomask 15 shown in FIG. 14A, the reference monitor pattern 80 may be omitted.

Moreover, since the device pattern 40, the reference monitor pattern 80, and the exposure dose monitor pattern 90 on the photomask 15 have the same plane pattern shape and phase difference condition, the difference in the influences of a lens aberration and exposure dose of an exposure system can be eliminated almost completely. Therefore, it is possible to perform accurate exposure dose monitoring without being influenced by a lens aberration and focus deviation.

Note that the opening portion and the mask portion in the third embodiment of the present invention are reversed to make a photomask pattern for negative resist.

Incidentally, the above-described photomask according to the third embodiment of the present invention is provided with two monitor patterns. One of the monitor patterns has a pattern with the same plane pattern shape and size as those of the device pattern 40, and the exposure light transmittance of the opening portion in the one monitor pattern has the same conditions as those in the device pattern 40. However, instead of the reference monitor pattern 80, the opening portion long side length of the device pattern 40 may be directly set as a measurement object. In this case, the reference monitor pattern 80 can also be omitted from the photomask shown in FIGS. 14A and 14B.

Other Embodiments

Although the first to third embodiments have been described above, it is preferable to use a photomask having both of a monitor pattern for monitoring focus of an exposure system and a monitor pattern for monitoring exposure dose thereon.

Figure 21A:
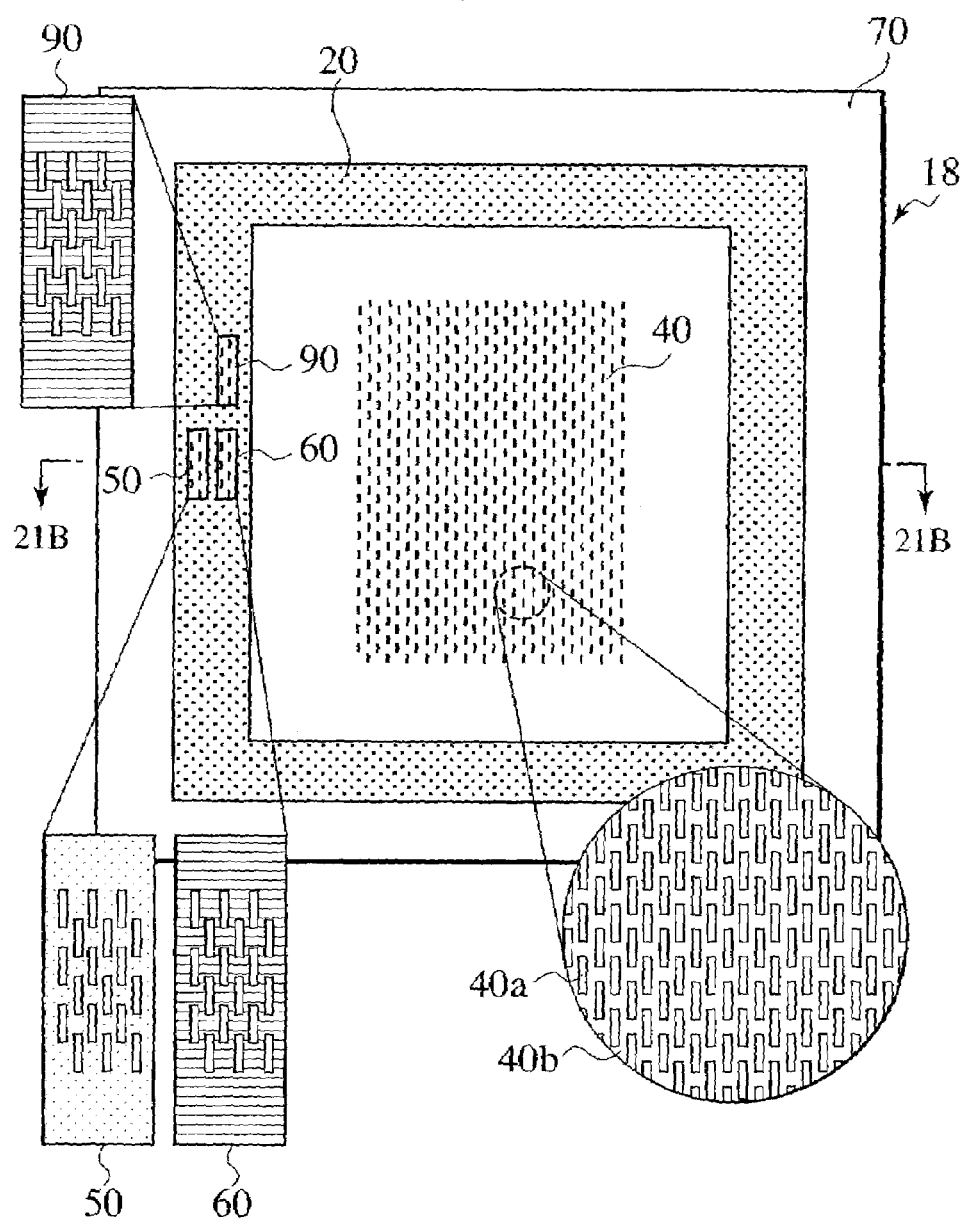
FIG. 21A is a plan view of a photomask according to other embodiments.
Figure 21B:
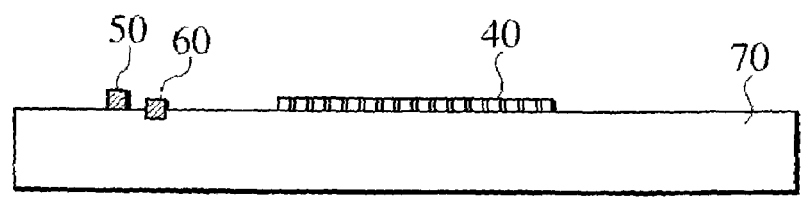
FIG. 21B is a cross-sectional view thereof.

For example, as shown in FIG. 21A, the reference monitor pattern 50 which has the same phase difference condition as the device pattern 40 and the focus monitor pattern 60 according to the first embodiment, as well as the exposure dose monitor pattern 90 according to the third embodiment are provided on a dicing region of a photomask 18.

When focus monitoring is performed, the dimension difference between corresponding long sides of the opening portions of the reference monitor pattern 50 and the focus monitor pattern 60 transferred on a wafer is measured. On the other hand, when exposure dose monitoring is performed, the opening portion long side dimension difference between the reference monitor pattern 50 and the exposure dose monitor pattern 90 transferred on a wafer is determined.

If the photomask 18 is used, both the focus and the exposure dose can be monitored.

Alternatively, the first and second focus monitor patterns 62 and 52 according to the second embodiment and the reference monitor pattern 80 and the exposure dose monitor pattern 90 according to the third embodiment may be provided on one photomask.

Note that monitor patterns formed on one photomask have no limitation on numbers and locations as far as the monitor patterns are formed in portions other than a device pattern formation region.

Manufacture of Semiconductor Device

FIG. 22 is a flowchart in the case where a semiconductor device is manufactured using the photomask and the focus monitoring method according to the first embodiment.

First, prior to the manufacture of a product lot of the semiconductor device, in step 101, transferred pattern samples for focus monitoring are prepared using the photomask 10 according to the first embodiment shown in FIG. 3A. These transferred pattern samples are respectively prepared under a plurality of different conditions of the defocus value of an exposure system using the photomask 10 according to the first embodiment. With regard to photolithography conditions other than the defocus value, the same conditions as the product lot are used.

Next, in step 102, the long side dimensions L0 and L1 of the transferred monitor patterns 50 and 60 of the prepared samples are measured using a SEM, and focus calibration curve data showing the relationship between the defocus value and the dimension difference (L1–L0) is prepared.

From the focus calibration curve data prepared in step 102, the best focus position of the exposure system is determined, and the exposure system is set to the focus position (step 103).

After the position of the exposure system is adjusted to the focus position in this way, the actual product lot of the semiconductor device is released into a manufacturing process using the photomask 10 according to the first embodiment (step 104).

When the manufacture of the product lot is finished, a plurality of wafers are extracted from the manufactured wafers, and the opening portion long side dimensions L1 and L0 of the transferred monitor pattern 50 and 60 are measured for each wafer to determine the average of the dimension difference (L1–L0) (step 105).

Based on the focus calibration curve data determined in step 102, the presence or absence of focus position deviation is determined from the average of the dimension difference (L1–L0) (step 106). If there is no focus position deviation, the procedure goes to the manufacturing process of the subsequent product lot of the semiconductor device (step 108). Meanwhile, if there is focus position deviation, the defocus value is determined from the focus calibration curve data, and this value is fed back to the exposure system conditions to readjust the focus position of the exposure system (step 107). Thereafter, the subsequent product lot of the semiconductor device is manufactured.

If there is no subsequent product lot, the process is finished. Meanwhile, if there is a subsequent product lot, the process returns to step 105 (step 109) again and then repeats steps 105 to 108.

Thus, when a semiconductor device is manufactured using the photomask 10 according to the first embodiment, the defocus value is fed back to adjust the focus position of an exposure system for each lot. Accordingly, focus monitoring with high accuracy can be performed. Therefore, a pattern accuracy error caused by focus deviation can be suppressed to improve the yield of a product.

A manufacturing method of a semiconductor device which uses the focus monitoring method according to the second embodiment and the exposure dose monitoring method according to the third embodiment, can be also performed according to the similar procedure.

As described above, though the photomask, the focus monitoring method, the exposure dose monitoring method, and the semiconductor device manufacturing method of the present invention have been described along the embodiments, the present invention is not limited to these descriptions. It will be apparent to those skilled in the art that various replacements of materials, variations, and modifications can be made in the present invention.

For example, though a pattern having unit patterns which are repeatedly arranged at a constant pitch is described as an example of a device pattern in the above-described first to third embodiments, a device pattern in which a pattern size and a pattern pitch vary depending on a position may be used. In this case, it is preferable that a pattern area having conditions where resolution is most strict is extracted and used as a focus monitor pattern or an exposure dose monitor pattern.

As described above, according to the first and second photomasks of the first and second aspects in the present invention, the dimension difference between corresponding portions of the first focus monitor pattern and any one of the device pattern, the reference monitor pattern, and the second focus monitor pattern obtained by being transferred on a wafer changes in response to the change in the deviation distance from the focus of an exposure light source (defocus value). Accordingly, the relationship between the dimension difference and the defocus value can be used as a focus calibration curve. Moreover, by adjusting the phase difference in transmitted exposure light between the opening portion and the mask portion of the first focus monitor pattern, a focus calibration curve in which the dimension difference largely changes with respect to the change in the defocus value can be obtained. Furthermore, since the first focus monitor pattern has the same plane pattern shape, that is, the shape, size, pitch, arrangement direction, and so forth of each opening pattern, as part of the device pattern, it is possible to obtain a focus calibration curve varying little even with respect to the variation in an lens aberration or exposure dose of an exposure light source which may cause different influences depending on the shape and size of a pattern.

Moreover, according to the focus monitoring method using the above-described first and second photomasks of the present invention, the dimension difference $\Delta L$ between corresponding portions of the first focus monitor pattern and any one of the device pattern, the reference monitor pattern, and the second focus monitor pattern, which are simultaneously transferred on a wafer in a fabrication step of the device pattern of the semiconductor device, is measured. Thus, it is possible to detect the deviation distance from the focus of the exposure light source (defocus value) and to adjust the focus based on a focus calibration curve previously prepared.

Furthermore, according to the semiconductor device manufacturing method using the above-described focus monitoring method of the present invention, a semiconductor device with high pattern accuracy can be manufactured by using a high sensitive focus monitoring method.

According to the third photomask of the third aspect in the present invention, the dimension difference between certain corresponding portions of the exposure dose monitor pattern and any of the device pattern and the reference monitor pattern which are transferred on a wafer changes in response to the change in the exposure dose. Therefore, the relationship between the exposure dose and this dimension difference can be used as an exposure dose calibration curve. Moreover, the exposure dose monitor pattern has the same plane pattern shape as a part of the device pattern, that is, each opening pattern of the exposure dose monitor pattern has the same shape, size, pitch, arrangement direction, and so forth as that of the device pattern. Accordingly, it is possible to obtain an exposure dose calibration curve which varies little even with respect to the variation in a lens aberration of an exposure light source or the defocus value that may cause different influences depending on differences in a shape or size of a pattern.

Moreover, according to the exposure dose monitoring method of the present invention using the third photomask, by measuring the dimension difference $\Delta L$ between certain corresponding portions of the exposure dose monitor pattern and any of the device pattern and the reference monitor pattern which are simultaneously transferred on a wafer in the device pattern fabrication step of a semiconductor device, the variation value $\Delta E$ of exposure dose can be detected, and the exposure dose can be adjusted based on the previously prepared exposure dose calibration curve.

Furthermore, according to the other semiconductor device manufacturing method using the above-described the exposure dose monitoring method of the present invention, a semiconductor device with high pattern accuracy can be manufactured.

What is claimed is:

1. A photomask comprising:
    a mask substrate;
    a device pattern which is disposed on the mask substrate and has an opening portion and a mask portion; and
    a first focus monitor pattern which is disposed on the mask substrate and has an opening portion and a mask portion, the first focus monitor pattern having the same plane pattern shape as at least a partial region of the device pattern,
    wherein a phase difference in transmitted exposure light between the opening portion and the mask portion of the first focus monitor pattern is different from a phase difference in transmitted exposure light between the opening portion and the mask portion of the device pattern.

2. The photomask according to claim 1, further comprising:
a reference monitor pattern which is disposed on the mask substrate and has an opening portion and a mask portion, the reference monitor pattern having the same plane pattern shape as the first focus monitor pattern,
wherein a phase difference in transmitted exposure light between the opening portion and the mask portion of the reference monitor pattern is the same as the phase difference in transmitted exposure light between the opening portion and the mask portion of the device pattern.

3. A photomask comprising:
a mask substrate;
a device pattern which is disposed on the mask substrate and has an opening portion and a mask portion;
a first focus monitor pattern which is disposed on the mask substrate and has an opening portion and a mask portion, the first focus monitor pattern having the same plane pattern shape as at least a partial region of the device pattern; and
a second focus monitor pattern which is disposed on the mask substrate and has an opening portion and a mask portion, the second focus monitor pattern having the same plane pattern shape as the first focus monitor pattern,
wherein a phase difference in transmitted exposure light between the opening portion and the mask portion of the second focus monitor pattern and a phase difference in transmitted exposure light between the opening portion and the mask portion of the first focus monitor pattern have approximately the same absolute values and opposite signs.

4. The photomask according to claim 1,
wherein the phase difference in transmitted exposure light between the opening portion and the mask portion of the first focus monitor pattern satisfies a condition that a dimension difference between corresponding portions of the device pattern and the first focus monitor pattern which have been transferred on a wafer shows any one of an approximately monotone increase and an approximately monotone decrease with respect to a change in a deviation distance from a focus position of an exposure light source.

5. The photomask according to claim 2,
wherein the phase difference in transmitted exposure light between the opening portion and the mask portion of the first focus monitor pattern satisfies a condition that a dimension difference between corresponding portions of the reference monitor pattern and the first focus monitor pattern which have been transferred on a wafer shows any one of an approximately monotone increase and an approximately monotone decrease with respect to a change in a deviation distance from a focus position of an exposure light source.

6. The photomask according to claim 3,
wherein the phase difference in transmitted exposure light between the opening portion and the mask portion of the first focus monitor pattern and the phase difference in transmitted exposure light between the opening portion and the mask portion of the second focus monitor pattern satisfy a condition that a dimension difference between corresponding portions of the first focus monitor pattern and the second focus monitor pattern which have been transferred on a wafer shows any one of an approximately monotone increase and an approximately monotone decrease with respect to a change in a deviation distance from a focus position of an exposure light source.

7. The photomask according to claim 1,
wherein the first focus monitor pattern is disposed in a region on the mask substrate which corresponds to a dicing region on a wafer.

8. The photomask according to claim 2,
wherein the first focus monitor pattern and the reference monitor pattern are disposed in a region on the mask substrate which corresponds to a dicing region on a wafer.

9. The photomask according to claim 3,
wherein the first and second focus monitor patterns are disposed in a region on the mask substrate which corresponds to a dicing region on a wafer.

10. A photomask comprising:
a mask substrate;
a device pattern which is disposed on the mask substrate and has an opening portion and a mask portion; and
an exposure dose monitor pattern which is disposed on the mask substrate and has an opening portion and a mask portion, the exposure dose monitor pattern having the same plane pattern shape as at least a partial region of the device pattern,
wherein a phase difference in transmitted exposure light between the opening portion and the mask portion of the exposure dose monitor pattern is the same as a phase difference in transmitted exposure light between the opening portion and the mask portion of the device pattern, and the opening portion of the exposure dose monitor pattern has a different transmittance for exposure light from a transmittance of the opening portion of the device pattern.

11. The photomask according to claim 10, further comprising:
a reference monitor pattern which is disposed on the mask substrate and has an opening portion and a mask portion, the reference monitor pattern having the same plane pattern shape as the exposure dose monitor pattern,
wherein a phase difference in transmitted exposure light between the opening portion and the mask portion of the reference monitor pattern is the same as a phase difference in transmitted exposure light between the opening portion and the mask portion of the device pattern, and the opening portion of the reference monitor pattern has the same transmittance for exposure light as the opening portion of the device pattern.

12. The photomask according to claim 10,
wherein the exposure light transmittance of the opening portion of the exposure dose monitor pattern is within a range in which conditions enabling a pattern with a contrast to be transferred on a wafer are satisfied.

13. The photomask according to claim 10,
wherein the opening portion of the device pattern and the opening portion of the exposure dose monitor pattern have transmittances for exposure light which are different from a transmittance for exposure light of the opening portion of the device pattern by 2% to 16%.

14. A method of monitoring focus using the photomask as set forth in claim 1, comprising:
preparing focus calibration curve data showing a relationship between a deviation distance from a focus of an exposure light source and a dimension difference between corresponding portions of a device pattern transferred on a wafer and a first focus monitor pattern transferred on the wafer using the photomask;

fabricating a device pattern of a semiconductor device using the photomask;

measuring a dimension difference ΔL between corresponding portions of a device pattern transferred on a wafer and a first focus monitor pattern transferred on the wafer by the fabricating the device pattern step;

detecting a deviation distance ΔD from the focus of the exposure light source based on the measured dimension difference ΔL and the focus calibration curve data; and adjusting a position of the exposure light source to a focus position based on the detected deviation distance ΔD from the focus.

15. The method of monitoring focus according to claim 14, wherein the preparing the calibration curve data step comprises:

transferring a pattern of the photomask on a wafer for each of a plurality of conditions with different distances between the exposure light source and a wafer; and measuring a dimension difference ΔL between corresponding portions of a device pattern transferred on a wafer and a first focus monitor pattern transferred on the wafer.

16. A method of monitoring focus using the photomask as set forth in claim 2, comprising:

preparing focus calibration curve data showing a relationship between a deviation distance from a focus of an exposure light source and a dimension difference between corresponding portions of a reference monitor pattern transferred on a wafer and a first focus monitor pattern transferred on the wafer using the photomask;

fabricating a device pattern of a semiconductor device using the photomask;

measuring a dimension difference ΔL between corresponding portions of a reference monitor pattern transferred on a wafer and a first focus monitor pattern transferred on the wafer by the fabricating the device pattern step;

detecting a deviation distance ΔD from the focus of the exposure light source based on the measured dimension difference ΔL and the focus calibration curve data; and adjusting a position of the exposure light source to a focus position based on the detected deviation distance ΔD from the focus.

17. The method of monitoring focus according to claim 16, wherein the preparing the calibration curve data step comprises:

transferring a pattern of the photomask on a wafer for each of a plurality of conditions with different distances between the exposure light source and a wafer; and measuring a dimension difference ΔL between corresponding portions of a reference monitor pattern transferred on a wafer and a first focus monitor pattern transferred on the wafer.

18. A method of monitoring focus using the photomask as set forth in claim 3, comprising:

preparing focus calibration curve data showing a relationship between a deviation distance from a focus of an exposure light source and a dimension difference between corresponding portions of a second focus monitor pattern transferred on a wafer and a first focus monitor pattern transferred on the wafer using the photomask;

fabricating a device pattern of a semiconductor device using the photomask;

measuring a dimension difference ΔL between corresponding portions of a second focus monitor pattern transferred on a wafer and a first focus monitor pattern transferred on the wafer by the fabricating the device pattern step;

detecting a deviation distance ΔD from the focus of the exposure light source based on the measured dimension difference ΔL and the focus calibration curve data; and adjusting a position of the exposure light source to a focus position based on the detected deviation distance ΔD from the focus.

19. The method of monitoring focus according to claim 18, wherein the preparing the calibration curve data step comprises:

transferring a pattern of the photomask on a wafer for each of a plurality of conditions with different distances between the exposure light source and a wafer; and measuring a dimension difference ΔL between corresponding portions of a second focus monitor pattern transferred on a wafer and a first focus monitor pattern transferred on the wafer.

20. A method of monitoring exposure dose using the photomask as set forth in claim 10, comprising:

preparing exposure dose calibration curve data showing a relationship between exposure dose and a dimension difference between corresponding specific portions of an exposure dose monitor pattern transferred on a wafer and any one of a device pattern and a reference monitor pattern transferred on the wafer using the photomask;

fabricating a device pattern of a semiconductor device using the photomask;

measuring a dimension difference ΔL between corresponding portions of an exposure dose monitor pattern transferred on a wafer and any one of a device pattern and a reference monitor pattern transferred on the wafer by the fabricating the device pattern step;

detecting a variation value ΔE of the exposure dose of an exposure light source based on the measured dimension difference ΔL and the exposure dose calibration curve data; and adjusting the exposure dose based on the detected variation value ΔE of the exposure dose.

21. The method of monitoring exposure dose according to claim 20, wherein the preparing the calibration curve data step comprises:

transferring a pattern of the photomask on a wafer for each of a plurality of conditions with different exposure energies; and measuring a dimension difference ΔL between corresponding portions of an exposure dose monitor pattern transferred on a wafer and any one of a device pattern and a reference monitor pattern transferred on the wafer.

22. A method of manufacturing a semiconductor device, comprising:

patterning by use of the method of monitoring focus according to claim 14 under conditions in which the focus position of the exposure light source is controlled.

23. A method of manufacturing a semiconductor device, comprising:

patterning by use of the method of monitoring focus according to claim 16 under conditions in which the focus position of the exposure light source is controlled.

24. A method of manufacturing a semiconductor device, comprising:

patterning by use of the method of monitoring focus according to claim 18 under conditions in which the focus position of the exposure light source is controlled.

25. A method of manufacturing a semiconductor device, comprising:

patterning by use of the method of monitoring focus according to claim 20 under conditions in which the exposure dose is controlled.

* * * * *